US012628333B2

(12) United States Patent
Ahn

(10) Patent No.: US 12,628,333 B2
(45) Date of Patent: May 12, 2026

(54) SEMICONDUCTOR DEVICE INCLUDING A SEPERATION LAYER

(71) Applicant: Samsung Electronics Co., Ltd., Suwon-si (KR)

(72) Inventor: Junhyeok Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 368 days.

(21) Appl. No.: 18/326,988

(22) Filed: May 31, 2023

(65) Prior Publication Data

US 2024/0023319 A1    Jan. 18, 2024

(30) Foreign Application Priority Data

Jul. 12, 2022    (KR) ......................... 10-2022-0085548

(51) Int. Cl.
H10B 12/00        (2023.01)

(52) U.S. Cl.
CPC ........... H10B 12/482 (2023.02); H10B 12/02 (2023.02); H10B 12/315 (2023.02); H10B 12/34 (2023.02); H10B 12/485 (2023.02)

(58) Field of Classification Search
CPC ........ H10B 12/00; H10B 12/02; H10B 12/05; H10B 12/053; H10B 12/315; H10B 12/34; H10B 12/482; H10B 12/485; H10B 12/488; H10D 12/115
See application file for complete search history.

(56) References Cited

U.S. PATENT DOCUMENTS

| | | |
|---|---|---|
| 2013/0256769 A1 | 10/2013 | Jeong et al. |
| 2014/0112050 A1 | 4/2014 | Park |
| 2014/0203357 A1 | 7/2014 | Kim et al. |
| 2015/0061134 A1 | 3/2015 | Lee et al. |
| 2016/0163637 A1* | 6/2016 | Jung ...................... H10B 12/50 257/776 |
| 2022/0093387 A1 | 3/2022 | Lee et al. |
| 2022/0384449 A1 | 12/2022 | Kim et al. |

FOREIGN PATENT DOCUMENTS

| | | |
|---|---|---|
| KR | 1020120027697 A | 3/2012 |
| KR | 1020140095657 A | 8/2014 |
| KR | 101928310 B1 | 12/2018 |
| KR | 101933044 B1 | 12/2018 |
| KR | 102059863 B1 | 12/2019 |
| KR | 102283813 B1 | 8/2021 |
| KR | 1020220040074 A | 3/2022 |

* cited by examiner

*Primary Examiner* — Hoai V Pham
(74) *Attorney, Agent, or Firm* — Muir Patent Law, PLLC

(57)        ABSTRACT
A semiconductor device includes an active region defined by a device isolation layer, a pad layer on the device isolation layer and a first region of the active region, a first separation layer penetrating through the pad layer and extending in a first direction, a second separation layer penetrating through the pad layer and extending in a second direction, a word line below the second separation layer, extending in the second direction, and embedded in a substrate, a bit line extending in the first direction and connected to a second region of the active region, a contact structure on a side surface of the bit line and connected to the pad layer, and an data storage structure on the contact structure and connected to the contact structure. The first separation layer includes an airgap or a material having a dielectric constant less than a dielectric constant of silicon nitride.

20 Claims, 20 Drawing Sheets

A

A

A

A

A

SEMICONDUCTOR DEVICE INCLUDING A SEPERATION LAYER

CROSS-REFERENCE TO RELATED APPLICATION(S)

This application claims the benefit under 35 U.S.C. § 119 to Korean Patent Application No. 10-2022-0085548 filed on Jul. 12, 2022 in the Korean Intellectual Property Office, the disclosure of which is herein incorporated by reference in its entirety.

BACKGROUND

1. Field

The present inventive concept relates to a semiconductor device.

2. Description of Related Art

According to the development of the electronics industry and the needs of users, electronic devices are becoming smaller in size and higher in performance. Accordingly, semiconductor devices used in electronic devices are also required to be highly integrated and high-performance. In order to fabricate a highly scaled semiconductor device, a technique for forming separation layers that electrically separating pad layers from each other on active regions is desirable.

SUMMARY

Example embodiments provide a semiconductor device having improved electrical characteristics and reliability.

According to example embodiments, a semiconductor device includes an active region defined by a device isolation layer in a substrate; a pad layer on the device isolation layer and a first region of the active region; a first separation layer penetrating through the pad layer and extending in a first direction; a second separation layer penetrating through the pad layer and extending in a second direction, intersecting the first direction; a word line buried in the substrate and disposed below the second separation layer, the word line extending across the active region in the second direction; a bit line extending in the first direction on the first separation layer and connected to a second region of the active region; a contact structure on a side surface of the bit line and connected to a portion of the pad layer; and a data storage structure on the contact structure and electrically connected to the contact structure. The first separation layer includes at least one of an airgap and a material having a dielectric constant less than a dielectric constant of silicon nitride.

According to example embodiments, a semiconductor device includes an active region defined by a device isolation layer in a substrate; a pad layer on the device isolation layer and a first region of the active region; a first separation layer penetrating through the pad layer and extending in a first direction; a bit line extending on the substrate in the first direction and connected to a second region of the active region; and a contact structure on a side surface of the bit line and connected to a portion of the pad layer. The first separation layer includes an airgap and an insulating pattern on the airgap.

According to example embodiments, a semiconductor device includes an active region defined by a device isolation layer in a substrate; a pad layer on the device isolation layer and a first region of the active region; a separation layer penetrating through the pad layer and extending in a first direction; a bit line extending on the substrate in the first direction and connected to a second region of the active region; and a contact structure on a side surface of the bit line and connected to a portion of the pad layer. The separation layer has a material having a dielectric constant less than a dielectric constant of silicon nitride.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
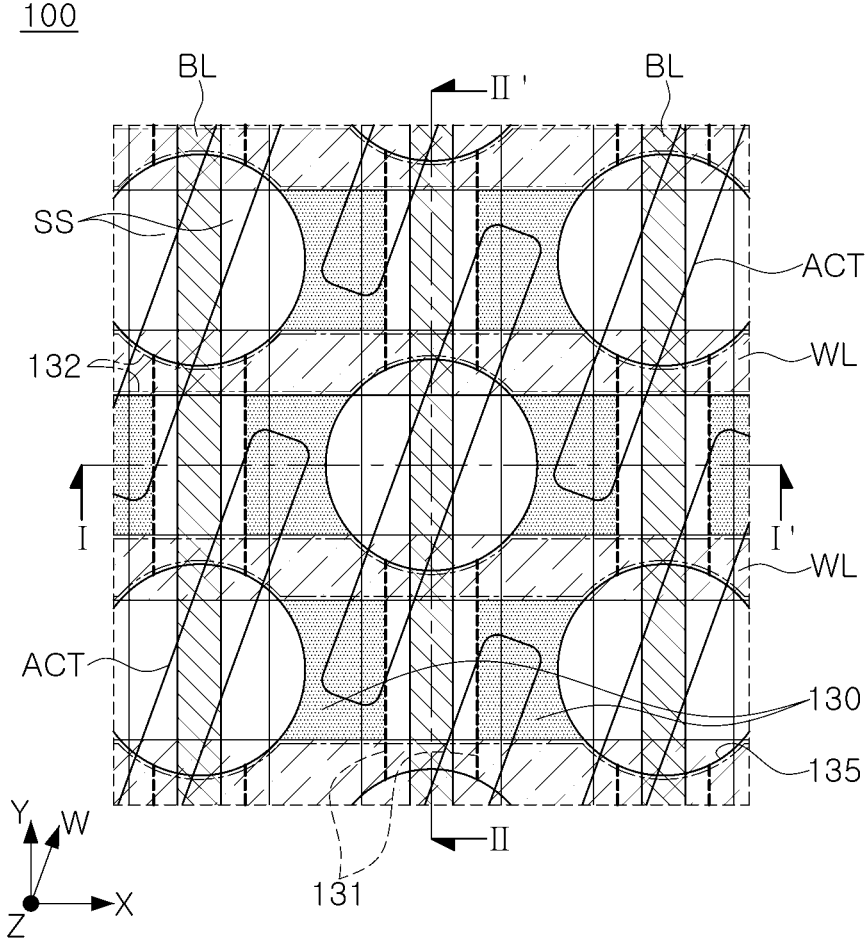
FIG. 1 is a plan view of a semiconductor device according to example embodiments.

FIG. 1 is a plan view of a semiconductor device according to example embodiments.

Figure 2:
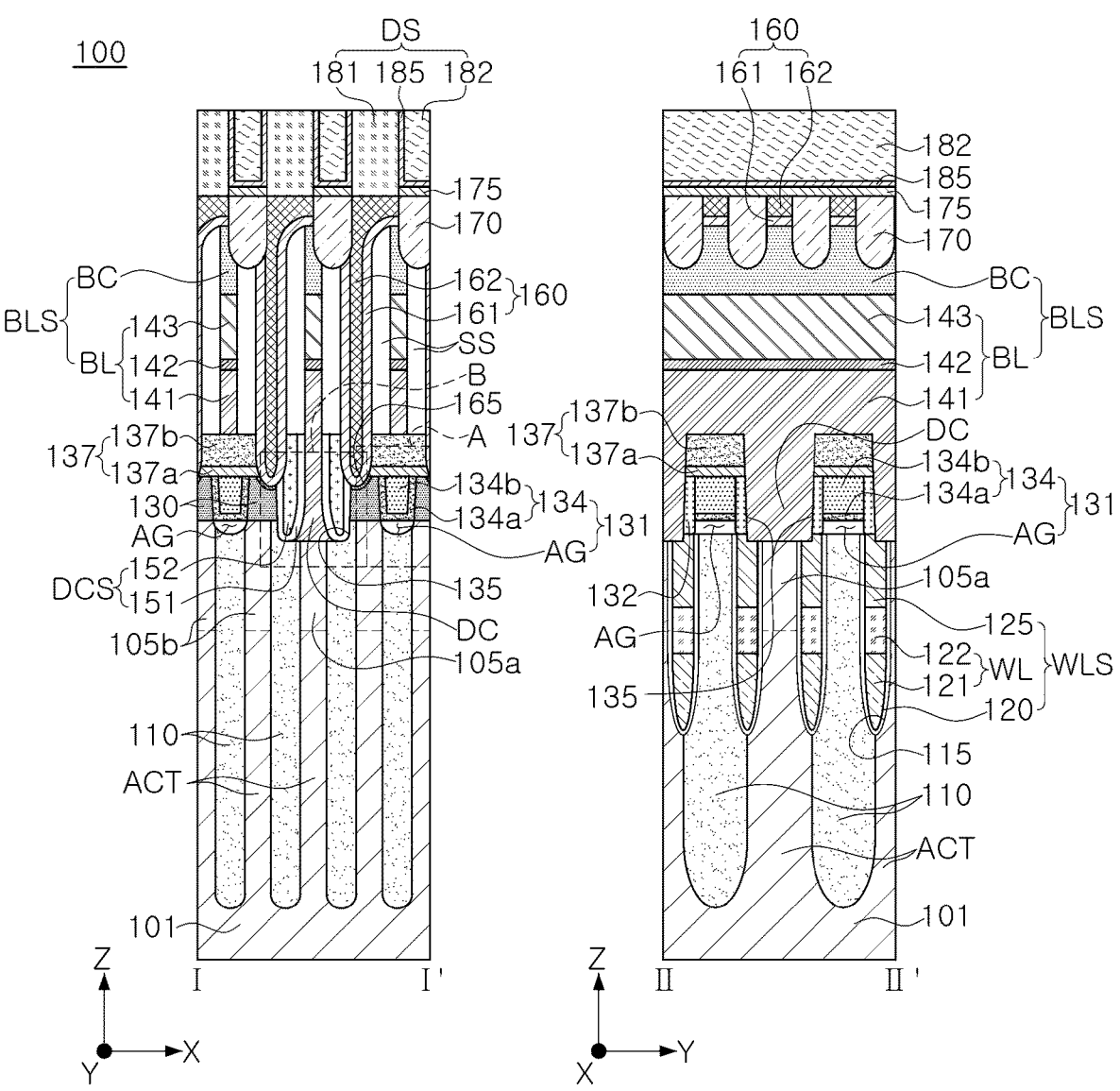
FIG. 2 is a cross-sectional view of a semiconductor device according to example embodiments.
Figure 3A:
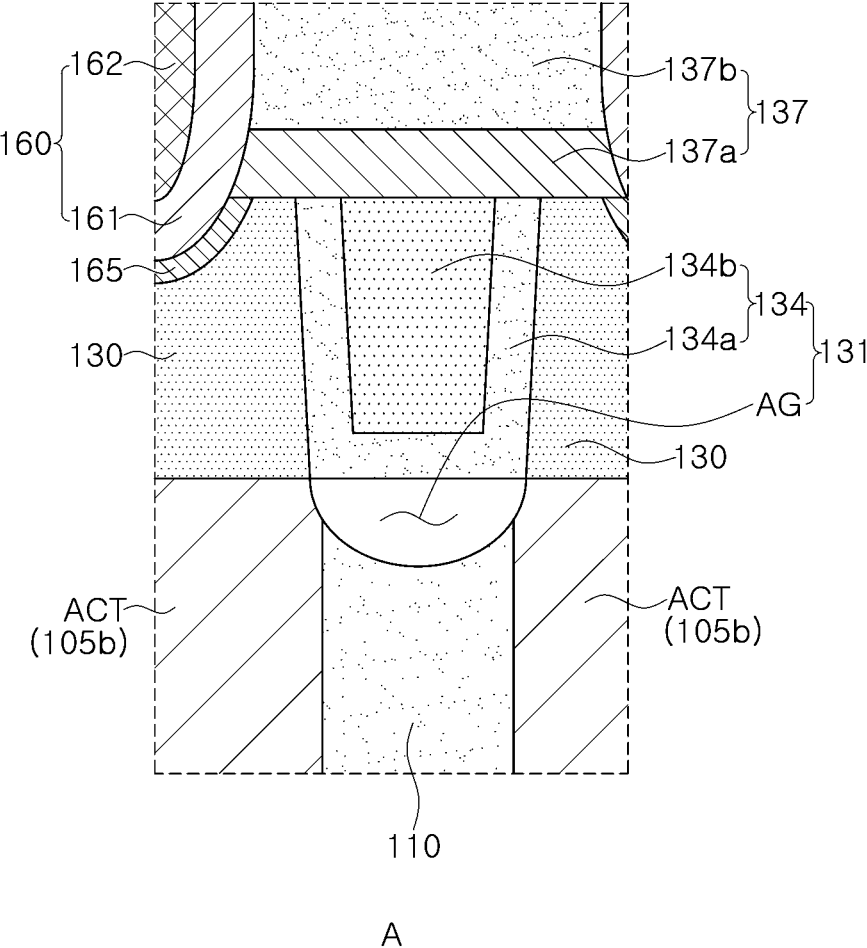
FIGS. 3A to 3F are partially enlarged cross-sectional views of semiconductor devices according to example embodiments.

FIG. 2 is a cross-sectional view of a semiconductor device according to example embodiments. FIG. 2 illustrates cross-sections of the semiconductor device of FIG. 1 taken along lines I-I' and FIG. 3A is a partially enlarged cross-sectional view of a semiconductor device according to example embodiments. FIG. 3A is an enlarged view of area 'A' of FIG. 2.

Referring to FIGS. 1 to 3A, a semiconductor device 100 may include a substrate 101, active regions ACT defined by a device isolation layer 110 in the substrate 101, pad layers 130 on the active regions ACT, first and second separation layers 131 and 132 penetrating through the pad layers 130, a word line structure WLS including a word line (WL), a bit line structure BLS including a bit line BL, a buffer insulating layer 137 between the bit line structure BLS and the first and second separation layers 131 and 132, a spacer structure SS on a side surface of the bit line structure BLS, a contact structure 160 on a side surface of the spacer structure SS, an isolation insulating pattern 170 separating the contact structure 160, and an data storage structure DS on the contact structure 160.

The semiconductor device 100 may include, for example, a cell array of a dynamic random access memory (DRAM). For example, the word line WL and the active region ACT constitute a memory cell transistor, the bit line BL is electrically connected to a first impurity region 105a of the active region ACT, and a second impurity region 105b of the active region ACT may be electrically connected to the data storage structure DS through the contact structure 160.

The substrate 101 may include or may be formed of a semiconductor material, for example, a group IV semiconductor, a group III-V compound semiconductor, or a group II-VI compound semiconductor. For example, the group IV semiconductor may include or may be formed of silicon, germanium, or silicon-germanium. The substrate 101 may further include impurities. The substrate 101 may be a silicon substrate, a silicon on insulator (SOI) substrate, a germanium substrate, a germanium on insulator (GOI) substrate, a silicon-germanium substrate, or a substrate including an epitaxial layer.

The active regions ACT may be defined in the substrate 101 by the device isolation layer 110. The active region ACT may have a bar shape, and may be disposed in the substrate 101 in an island shape extending in one direction, for example, a W direction. The W direction may be inclined with respect to the extension directions of the word lines WL and the bit lines BL. The active regions ACT may be arranged parallel to each other, and may be arranged such that an end of one active region ACT may be adjacent to a center of another active region ACT adjacent thereto.

The active region ACT may include or may be formed of single crystal silicon. The active region ACT may have first and second impurity regions 105a and 105b having a predetermined depth from the upper surface of the substrate 101. The first and second impurity regions 105a and 105b may be spaced apart from each other. The first impurity region 105a may be electrically connected to the bit line BL, and the second impurity region 105b may be connected to the pad layer 130. The first and second impurity regions 105a and 105b may serve as source/drain regions of the transistor formed by the word line WL. For example, a drain region may be formed between two word lines WL crossing one active region ACT, and a source region may be formed outside the two word lines WL, respectively. The source region and the drain region are formed by the first and second impurity regions 105a and 105b by doping or ion implantation with substantially the same impurities, and may be referred to interchangeably depending on the circuit configuration of the finally formed transistor. The impurities may include dopants having a conductivity type opposite to a conductivity type of the substrate 101. In example embodiments, depths of the first and second impurity regions 105a and 105b in the source region and the drain region may be different from each other. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The device isolation layer 110 may be formed in a shallow trench isolation (STI) process. The device isolation layer 110 surrounds the active regions ACT and may electrically isolate the active regions from each other. The device isolation layer 110 may be formed of an insulating material. The device isolation layer 110 may include a plurality of regions having different depths of lower ends according to the width of the trench in which the substrate 101 is etched. The device isolation layer 110 may include or may be formed of an insulating material, for example, at least one of silicon oxide, silicon nitride, silicon, and oxynitride.

The word line structures WLS may be disposed in gate trenches 115 extending in the substrate 101. Each of the word line structures WLS may include a gate dielectric layer

120, a word line WL, and a gate capping layer 125. In this specification, the 'gate (120, WL)' may be referred to as a structure including the gate dielectric layer 120 and the word line WL, the word line WL may be referred to as a 'gate electrode,' and the word line structure WLS may be referred to as a 'gate structure.'

The word line WL may be disposed to extend in an X direction across the active area ACT. The word line WL may be disposed below the second separation layer 132. For example, a pair of adjacent word lines WL may be disposed to cross one active area ACT. The word line WL may be buried in the substrate 101 to form a gate of a buried channel array transistor (BCAT), but the present inventive concept is not limited thereto. In example embodiments, the word lines WL may have a shape disposed on the substrate 101. The word line WL may be disposed at the bottom of the gate trench 115 to have a predetermined thickness. The upper surface of the word line WL may be positioned at a level lower than a level of the upper surface of the substrate 101. In this specification, positions of the term "level" may be defined based on or relative to a substantially flat upper surface of the substrate 101.

The word line WL is formed of a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al). For example, the word line WL may include a lower pattern 121 and an upper pattern 122 formed of different materials.

For example, the lower pattern 121 may include or may be formed of at least one of tungsten (W), titanium (Ti), tantalum (Ta), tungsten nitride (WN), titanium nitride (TiN), and tantalum nitride (TaN). For example, the upper pattern 122 may be a semiconductor pattern including polysilicon doped with P-type or N-type impurities, and the lower pattern 121 may be a conductive pattern including or being formed of at least one of metal and a metal nitride. The thickness of the lower pattern 121 may be greater than the thickness of the upper pattern 122.

The lower pattern 121 and the upper pattern 122 may extend in the X direction.

The gate dielectric layer 120 may be disposed on the bottom and inner surfaces of the gate trench 115. The gate dielectric layer 120 may conformally cover an inner side wall of the gate trench 115. The gate dielectric layer 120 may include or may be formed of at least one of silicon oxide, silicon nitride, and silicon oxynitride. The gate dielectric layer 120 may be, for example, a silicon oxide film or an insulating film having a high dielectric constant. In example embodiments, the gate dielectric layer 120 may be a layer formed by oxidizing the active region ACT or a layer formed by deposition.

The gate capping layer 125 may be disposed to fill the gate trench 115 on the word line WL. The upper surface of the gate capping layer 125 may be positioned at substantially the same level as the upper surface of the substrate 101. The gate capping layer 125 may be formed of an insulating material, for example, silicon nitride.

The pad layers 130 may be electrically connected to the second impurity regions 105b of the active regions ACT. The pad layers 130 may be disposed between the second impurity region 105b and the contact structure 160. The pad layers 130 may be separated from each other in the X direction by the first separation layer 131 and may be separated from each other in the Y direction by the second separation layer 132. The pad layers 130 may be conductive. For example, the pad layers 130 may be formed of a polysilicon layer including or doped with impurities, for example, a polysilicon layer having an N-type conductivity.

The first separation layer 131 may penetrate through the pad layers 130 and extend in the Y direction. A lower surface of the first separation layer 131 may be located at a level lower than a level of a lower surface of the pad layer 130. The upper surface of the first separation layer 131 may be substantially coplanar with the upper surface of the pad layer 130. The first separation layer 131 may include an airgap AG (i.e., an air gap) and an insulating pattern 134.

The airgap AG may be disposed between the insulating pattern 134 and a recessed upper surface of the device isolation layer 110. The airgap AG may be an empty space surrounded by the recessed upper surface of the device isolation layer 110, the active region ACT, the insulating pattern 134, and the second separation layer 132. A lower surface of the airgap AG may be convex toward the device isolation layer 110, and an upper surface thereof may be substantially flat. The phrase "air gap" or "airgap" will be understood to include gaps (e.g., pockets) of air or gases other than air, such as other atmospheric gases or chamber gases that may be present during manufacturing. An "air gap" or "airgap" may also constitute a space having no or substantially no gas or other material therein.

The insulating pattern 134 may be disposed on the airgap AG and may contact side surfaces of the pad layers 130. The insulating pattern 134 may include a first insulating layer 134a and a second insulating layer 134b on the first insulating layer 134a. In some embodiments, the first and second insulating layers 134a and 134b may be formed of the same material as each other or may have materials different from each other. In some embodiments, when the first and second insulating layers 134a and 134b may be formed of the same material, the first and second insulating layers 134a and 134b may be formed in separate processes, thereby forming an interface therebetween. The first insulating layer 134a may surround the lower surface and side surfaces of the second insulating layer 134b. The insulating pattern 134 may include or may be formed of an insulating material, for example, silicon oxide, silicon nitride, or silicon oxynitride. In another example, the insulating pattern 134 may be formed of a single insulating layer. The term "contact," as used herein, refers to a direct connection (i.e., touching) unless the context indicates otherwise.

Compared to the case in which the first separation layer 131 is formed of a single layer of silicon nitride, the electrical separation effect of the first separation layer 131 including the airgap AG may be better at the same depth than the first separation layer 131 of the single layer of silicon nitride. In addition, since the first separation layer 131 includes the airgap AG, mutual interference and parasitic capacitance between the active regions ACT adjacent to each other may be reduced, and leakage current may be prevented. Accordingly, the electrical characteristics of the semiconductor device may be improved.

The second separation layer 132 may penetrate through the pad layers 130 and extend in the X direction. A lower surface of the second separation layer 132 may be positioned at a level lower than a level of a lower surface of the pad layer 130. The upper surface of the second separation layer 132 may be substantially coplanar with the upper surface of the pad layer 130. The second separation layer 132 may be formed of silicon nitride or silicon oxynitride.

The buffer insulating layer 137 may include or may be formed of at least one material layer. For example, the buffer insulating layer 137 may include a first buffer insulating layer 137a and a second buffer insulating layer 137b on the first buffer insulating layer 137a. The first buffer insulating layer 137a and the second buffer insulating layer 137b may be formed of different insulating materials. For example, the first buffer insulating layer 137a may be formed of silicon oxide, and the second buffer insulating layer 137b may be formed of silicon nitride. The number and/or type of layers constituting the buffer insulating layer 137 may be variously changed according to example embodiments.

The bit line structure BLS may extend in one direction, for example, a Y direction, perpendicular to the X direction in which the word line WL extends. The bit line structure BLS may include a bit line BL and a bit line capping pattern BC on the bit line BL.

The bit line BL may include a first conductive pattern 141, a second conductive pattern 142, and a third conductive pattern 143 that are sequentially stacked. The bit line capping pattern BC may be disposed on the third conductive pattern 143. The buffer insulating layer 137 may be disposed between the first conductive pattern 141 and the substrate 101, and a portion (hereinafter, the bit line contact pattern DC) of the first conductive pattern 141 may be in contact with the first impurity region 105a of the active region ACT. The bit line BL may be electrically connected to the first impurity region 105a through the bit line contact pattern DC. The lower surface of the bit line contact pattern DC may be positioned at a level lower than a level of the upper surface of the substrate 101, and may be positioned at a level higher than a level of the upper surface of the word line WL. The bit line contact pattern DC may be formed in the substrate 101 to be locally disposed in the bit line contact hole 135 exposing the first impurity region 105a.

The first conductive pattern 141 may include or may be formed of a semiconductor material such as polycrystalline silicon. The first conductive pattern 141 may contact the first impurity region 105a. The second conductive pattern 142 may include or may be formed of a metal-semiconductor compound. The metal-semiconductor compound may be, for example, a silicide layer of a portion of the first conductive pattern 141. For example, the metal-semiconductor compound may include cobalt silicide (CoSi), titanium silicide (TiSi), nickel silicide (NiSi), tungsten silicide (WSi), or other metal silicides. The third conductive pattern 143 may include or may be formed of metal such as titanium (Ti), tantalum (Ta), tungsten (W), and aluminum (Al). The number of conductive patterns constituting the bit line BL, the type of material, and/or the stacking order may be variously changed according to example embodiments.

The bit line capping pattern BC may be disposed on the third conductive pattern 143. The bit line capping pattern BC may include or may be formed of an insulating material, for example, a silicon nitride layer. The bit line capping pattern BC may include a plurality of layers including the same or different materials.

The spacer structures SS may be disposed on opposite side surfaces of each of the bit line structures BLS to extend in one direction, for example, the Y direction. The spacer structures SS may be disposed between the bit line structure BLS and the contact structure 160. The spacer structures SS may be disposed to extend along side surfaces of the bit line BL and side surfaces of the bit line capping pattern BC. Each of the spacer structures SS may include a plurality of spacers. The number and/or arrangement of the plurality of spacers may be variously changed according to example embodiments.

The spacer structures SS may further include a bit line contact spacer DCS. The bit line contact spacer DCS may fill the remainder of the bit line contact hole 135 in which the bit line contact pattern DC is formed. The bit line contact spacer DCS may include a plurality of spacer layers 151 and 152. The first spacer layer 151 may extend along the side surface of the bit line contact hole 135 and surround the bit line contact pattern DC, and the second spacer layer 152 may be disposed to fill the inner space of the first spacer layer 151. However, the structure of the bit line contact spacer DCS is not limited thereto, and may be variously changed according to example embodiments.

Each of the layers constituting the spacer structure SS may include or may be formed of an insulating material, for example, at least one of silicon oxide, silicon nitride, silicon oxynitride, and silicon oxycarbide.

The contact structure 160 may be connected to a portion of the pad layer 130, and may be electrically connected to a partial region of the active region ACT, for example, the second impurity region 105b. The contact structure 160 may be electrically connected to the second impurity region 105b through a metal-semiconductor compound layer 165 and the pad layer 130 disposed therebelow. The contact structure 160 may be disposed between adjacent bit line structures BLS, and may be disposed on a side surface of the spacer structure SS. The contact structure 160 may be disposed between adjacent spacer structures SS, for example. The lower surface of the contact structure 160 may be located at a level lower than a level of the upper surface of the substrate 101, and may be located at a level higher than a level of the lower surface of the bit line contact pattern DC. The contact structure 160 may be electrically insulated from the bit line BL by the spacer structure SS.

The contact structure 160 may include a barrier layer 161 and a contact conductive layer 162. The barrier layer 161 may surround a lower surface and side surfaces of the contact conductive layer 162. The barrier layer 161 may include or may be formed of, for example, a conductive metal nitride such as titanium nitride (TiN), tantalum nitride (TaN), and tungsten nitride (WN). The contact conductive layer 162 may include or may be formed of metal, for example, at least one of titanium (Ti), tantalum (Ta), tungsten (W), aluminum (Al), cobalt (Co), and ruthenium (Ru). In another example, a contact structure of a semiconductor material such as doped polysilicon may be further disposed between the contact structure 160 and the pad layer 130.

The metal-semiconductor compound layer 165 may be, for example, a layer in which a portion of the pad layer 130 is silicided. The metal-semiconductor compound layer 165 may be disposed between the pad layer 130 and the contact structure 160, and may surround at least a portion of a lower portion of the contact structure 160. The metal-semiconductor compound layer 165 may include or may be formed of, for example, metal silicide, metal germanide, or metal silicide-germanide. The metal-semiconductor compound layer 165 may include or may be formed of, for example, cobalt silicide (CoSi), titanium silicide (TiSi), nickel silicide (NiSi), tungsten silicide (WSi), or other metal silicide. In some embodiments, the metal-semiconductor compound layer 165 may be omitted.

The contact structure 160 may pass through the isolation insulating pattern 170. The isolation insulating pattern 170 may contact the spacer structure SS and the bit line capping pattern BC. The isolation insulating pattern 170 may include or may be formed of an insulating material, for example, silicon nitride or silicon oxynitride. The isolation insulating pattern 170 may have a shape in which a width in a horizontal direction becomes narrower as it approaches the substrate 101, and may have a side inclined with respect to the upper surface of the substrate 101.

The data storage structure DS may be disposed on the contact structure 160 and the isolation insulating pattern 170. The data storage structure DS may be electrically connected to the second impurity region 105b of the active region ACT through the contact structure 160. The data storage structure DS may include a first electrode 181, a second electrode 182, and a dielectric layer 185. The first electrode 181 may pass through the etch stop layer 175 to be connected to the contact structure 160. The first electrode 181 may have a pillar shape, but may have a cylinder shape in another example. The structure of the data storage structure DS is not limited to the illustrated one, and may be variously changed according to example embodiments.

Each of the first electrode 181 and the second electrode 182 may include or may be formed of at least one of a doped semiconductor material, a conductive metal nitride, a metal, and a metal-semiconductor compound. The dielectric layer 185 may conformally cover the first electrode 181. The dielectric layer 185 may include or may be formed of, for example, at least one of a high-k material such as zirconium oxide ($ZrO_2$), aluminum oxide ($Al_2O_3$), and hafnium oxide ($Hf_2O_3$).

FIGS. 3B to 3F are partially enlarged cross-sectional views of semiconductor devices according to example embodiments. FIGS. 3B to 3F illustrate areas corresponding to area 'A' in FIG. 2.

Figure 3B:
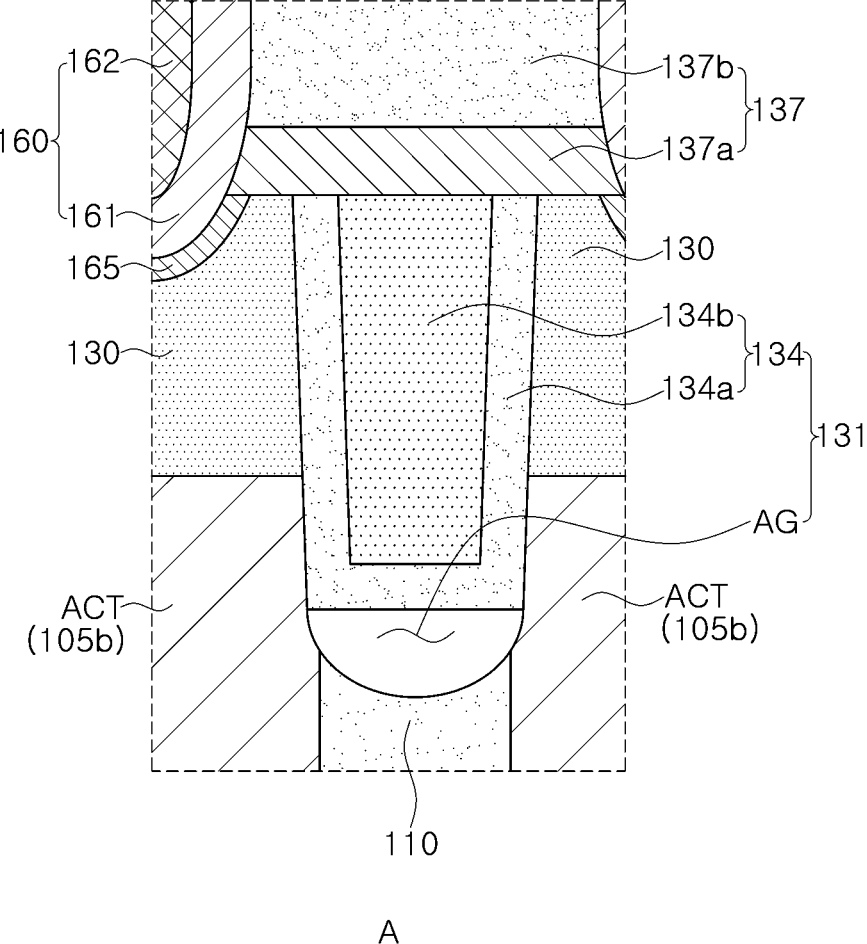

Referring to FIG. 3B, the lower end of the first separation layer 131 may be deeper than that of the previous embodiment, and the lower surface of the insulating pattern 134 may be disposed at a level lower than a level of the upper surface of the active region ACT. Electrical separation between the adjacent active regions ACT may be further secured by the airgap AG. In addition, electrical separation between the pad layer 130 and the active region ACT requiring electrical separation in an oblique direction by the first separation layer 131 may be further secured.

Figure 3C:
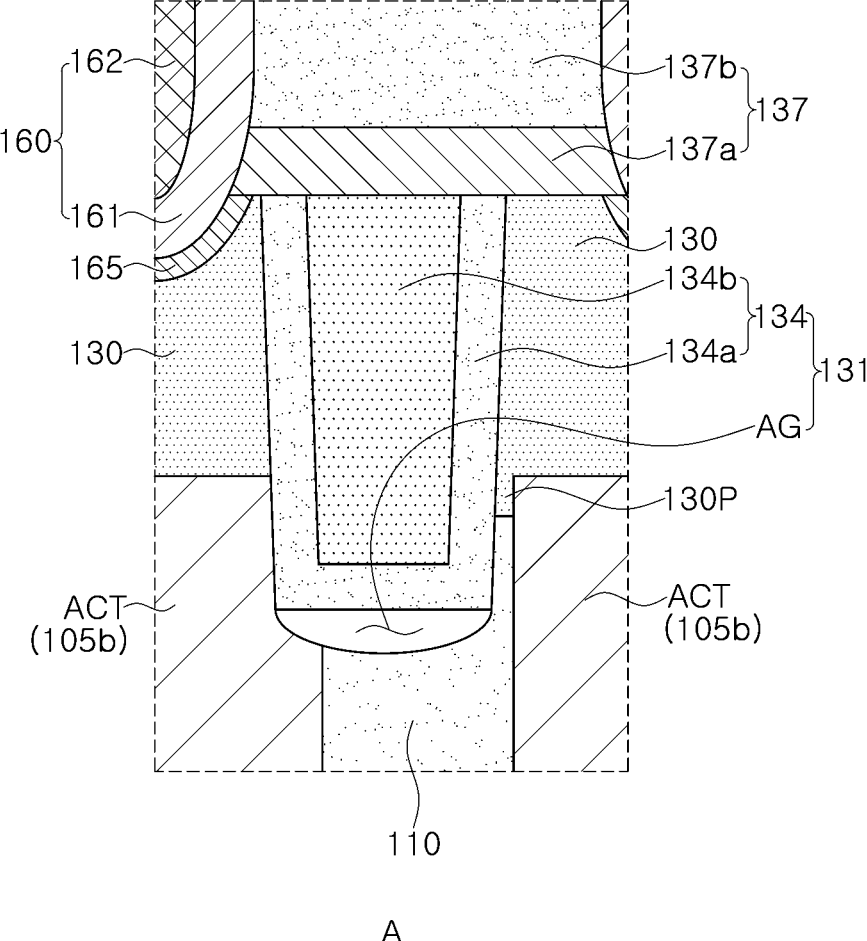

Referring to FIG. 3C, the pad layer 130 includes a pad protrusion 130P in contact with an upper side surface of the active region ACT protruding from an upper surface of the device isolation layer 110, and the first separation layer 131 may be in contact with the pad protrusion 130P. The pad protrusion 130P may contact the device isolation layer 110. The lower end of the pad protrusion 130P may be positioned at a level lower than a level of the upper end of the active area ACT and higher than a level of the lower end of the airgap AG. The airgap AG may be disposed between the active region ACT and the insulating pattern 134 and between the device isolation layer 110 and the insulating pattern 134. Electrical separation between the active region ACT requiring electrical separation in an oblique direction by the first separation layer 131 and the pad protrusion 130P of the pad layer 130 may be further secured by the airgap AG.

Figure 3D:
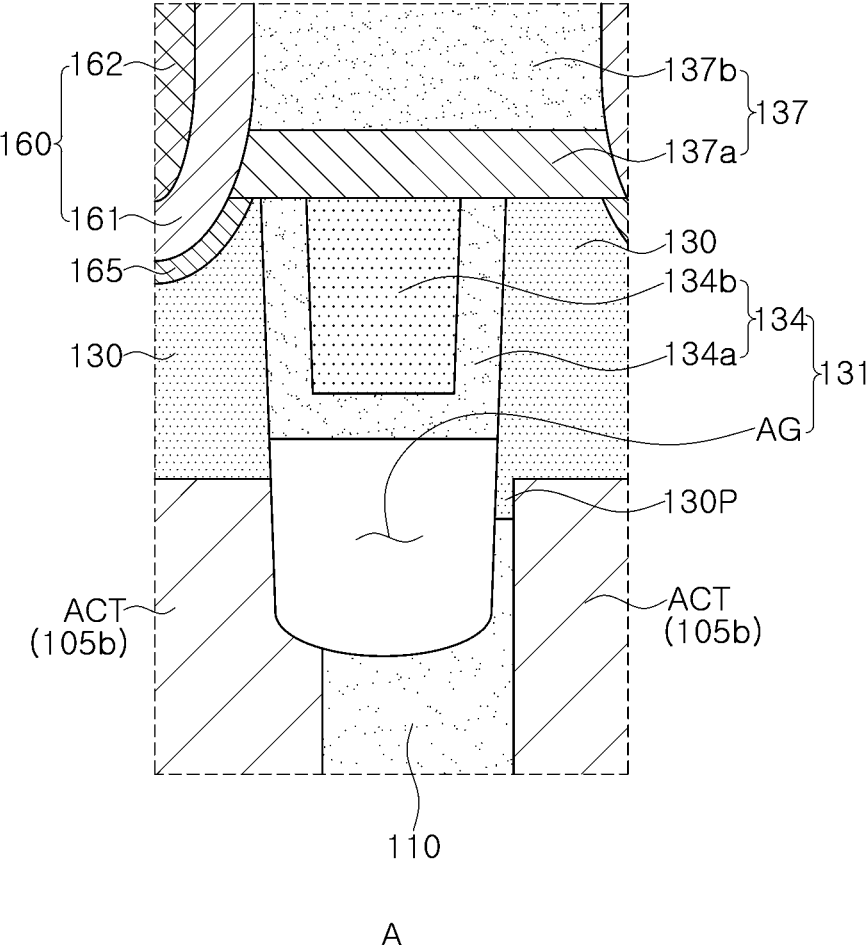

Referring to FIG. 3D, the airgap AG may have a greater depth, and the lower surface of the insulating pattern 134 may be positioned higher than the upper surface of the active region ACT. The pad protrusion 130P may contact the device isolation layer 110. The lower end of the pad protrusion 130P may be positioned at a level lower than a level of the upper end of the active area ACT and higher than a level of the lower end of the airgap AG. An upper surface of the air gap AG may be higher than the upper surface of the active region ACT. Electrical separation between the adjacent active regions ACT may be further secured by the airgap AG, and electrical separation between the active region ACT and the pad protrusion 130P of the pad layer 130, requiring electrical separation in an oblique direction, may be further secured by the first separation layer 131.

Figure 3E:
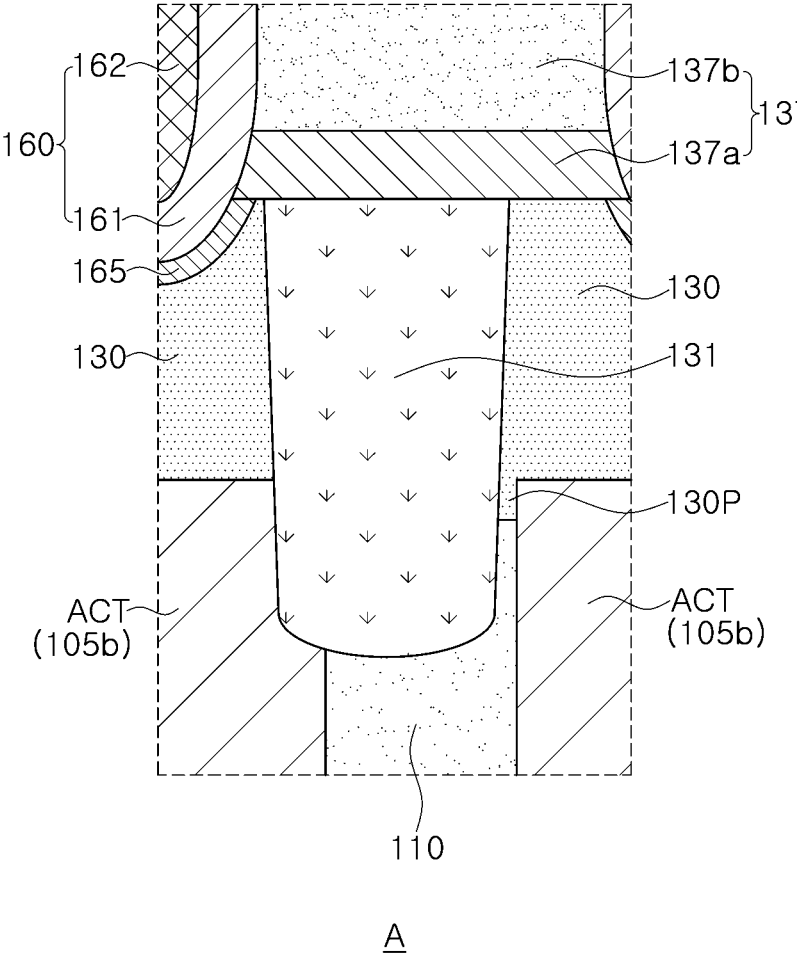

Referring to FIG. 3E, the first separation layer 131 may include or may be formed of a material other than silicon nitride, for example, a material having a dielectric constant lower than a dielectric constant of silicon nitride. For example, the first separation layer 131 may include or may be formed of at least one of silicon oxide, silicon oxycarbide, and silicon oxycarbonitride. The first separation layer 131 may be comprised of a single layer, but according to example embodiments, may be comprised of a plurality of layers of the above materials.

Figure 3F:
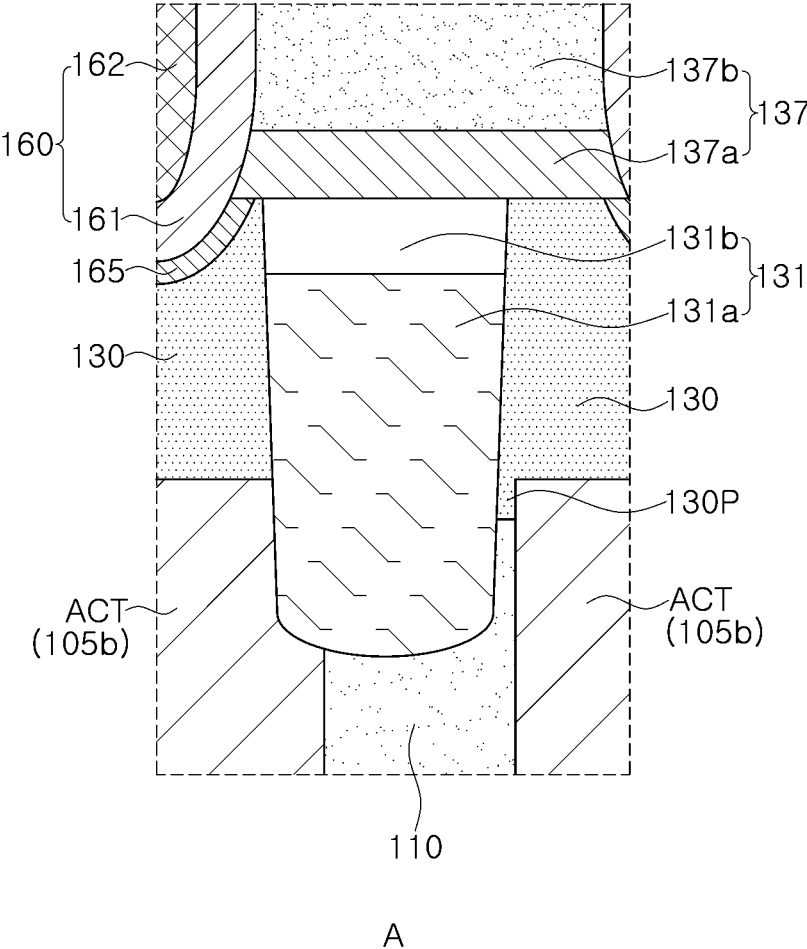

Referring to FIG. 3F, the first separation layer 131 may include an insulating layer 131a and a capping layer 131b on the insulating layer 131a. The insulating layer 131a of the first separation layer 131 may include or may be formed of a material having a dielectric constant lower than a dielectric constant of silicon nitride. The capping layer 131b may include or may be formed of silicon nitride or silicon oxynitride.

Figure 4A:
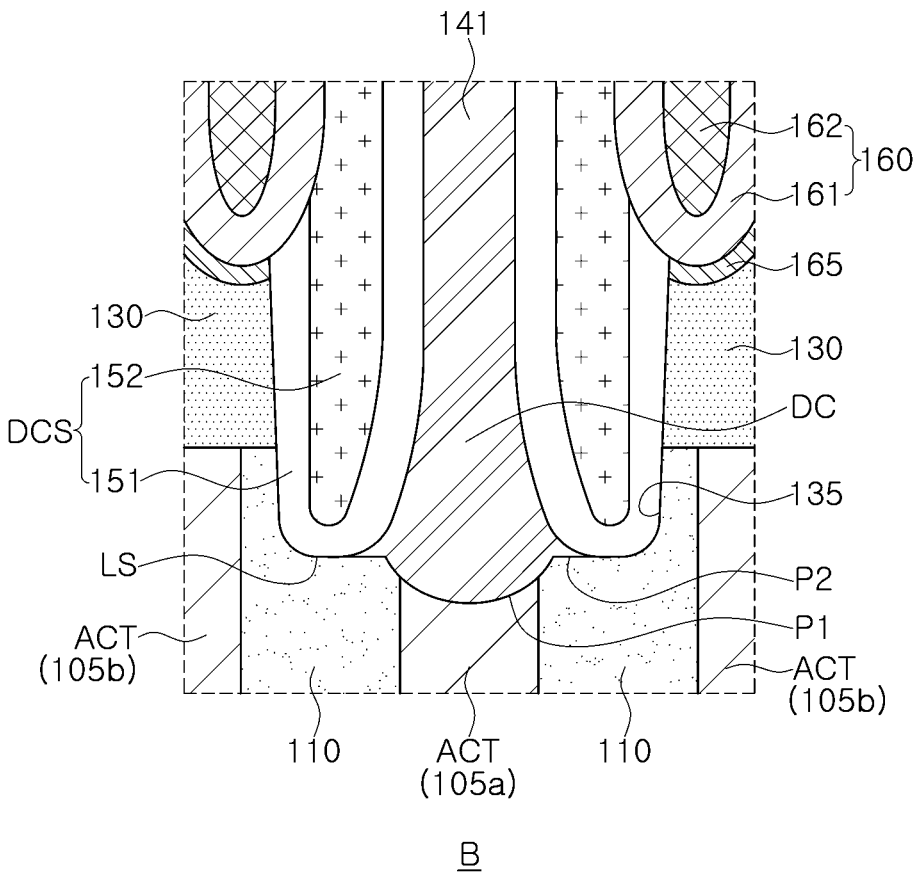
FIGS. 4A and 4B are partially enlarged cross-sectional views of semiconductor devices according to example embodiments.
Figure 4B:
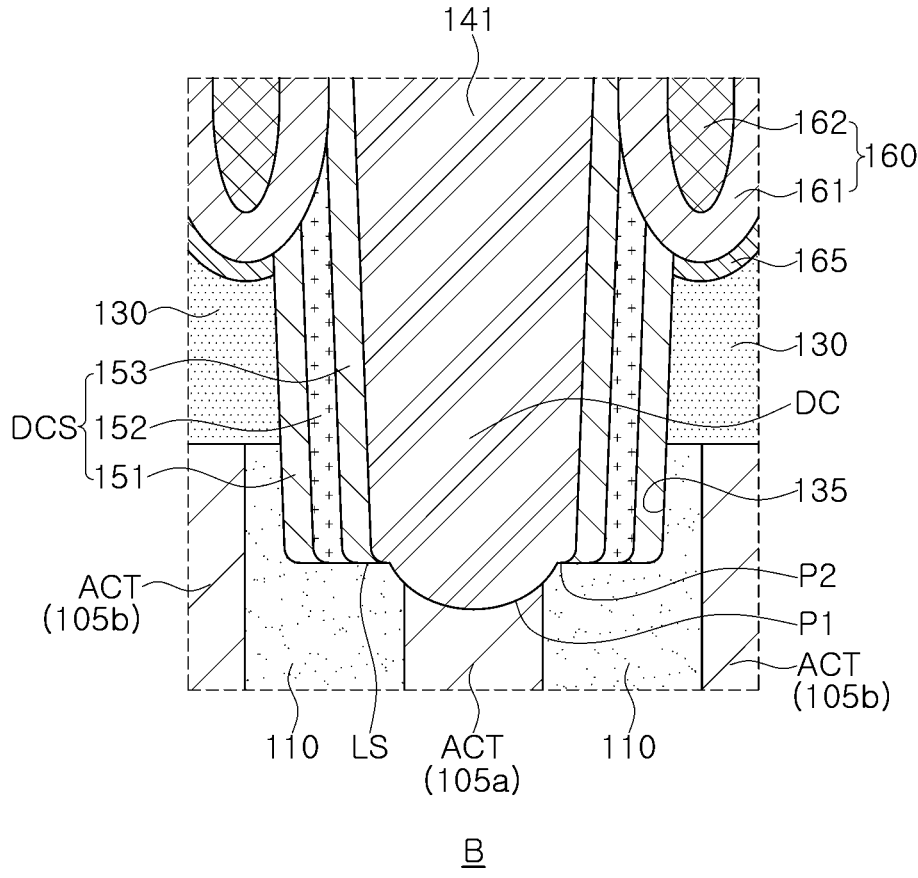

FIGS. 4A and 4B are partially enlarged cross-sectional views of semiconductor devices according to example embodiments. FIGS. 4A and 4B are enlarged views of an area corresponding to area 'B' of FIG. 2.

Referring to FIG. 4A, the lower surface of the bit line contact pattern DC of the first conductive pattern 141 may include a first portion P1 (i.e., a curved lower surface) and a second portion P2 (i.e., a flat lower surface) around the first portion P1. The first portion P1 may be disposed at a level lower than a level of the second portion P2. The first portion P1 may be positioned at a level lower than a level of the lower end LS of the bit line contact spacer DCS. The first portion P1 may have a shape that protrudes convexly downward further than the second portion P2. Accordingly, since the contact area between the bit line BL and the active region ACT is increased, the contact resistance may be reduced. Accordingly, the electrical characteristics of the semiconductor device may be improved.

Referring to FIG. 4B, the bit line contact spacer DCS may include a first spacer 151, a second spacer 152, and a third spacer 153 sequentially disposed from a sidewall of the bit line contact hole 135. A lower surface of the bit line contact pattern DC of the first conductive pattern 141 may include a first portion P1 and a second portion P2 around the first portion P1. Descriptions of the first portion P1 and the second portion P2 may be the same as those described with reference to FIG. 4A.

Figure 5A:
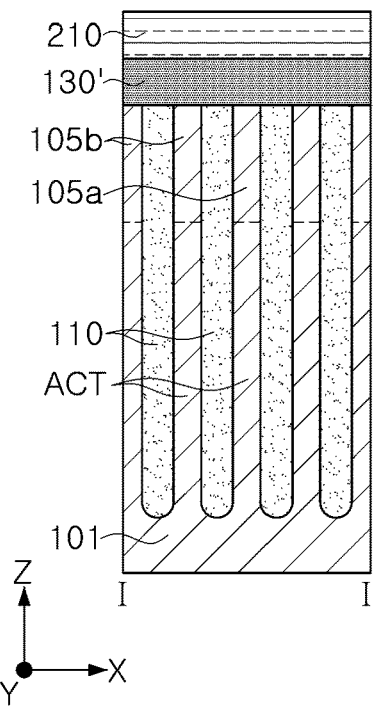
FIGS. 5A to 5I are cross-sectional views illustrating a method of manufacturing a semiconductor device according to example embodiments.
Figure 5A:
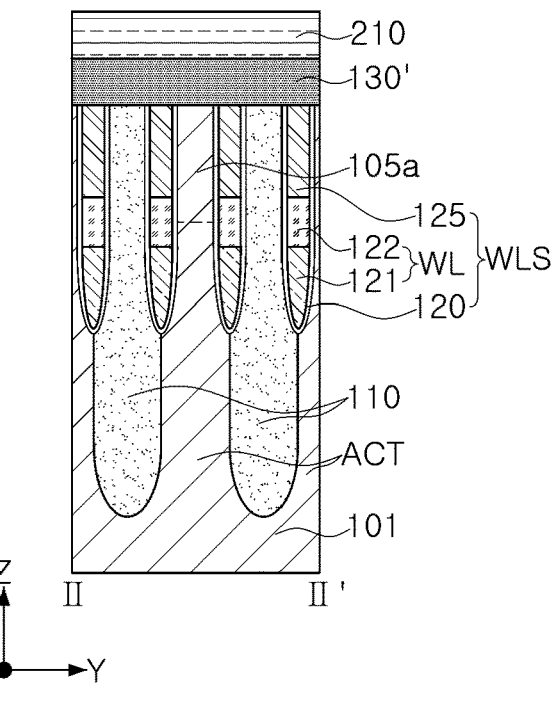
Figure 5B:
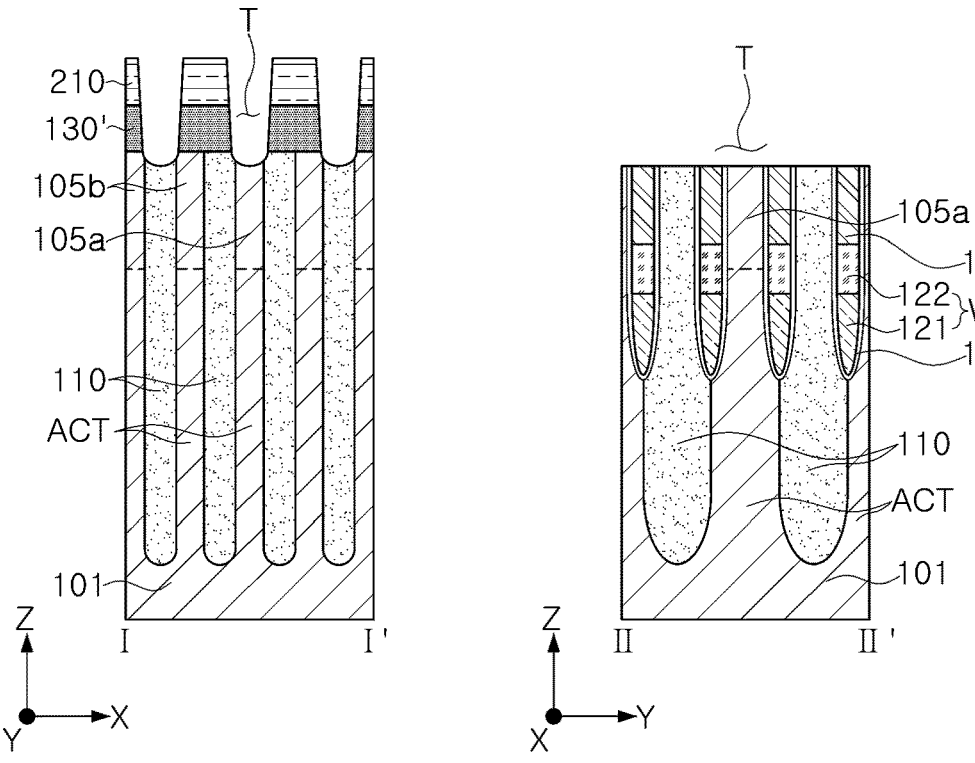
Figure 5C:
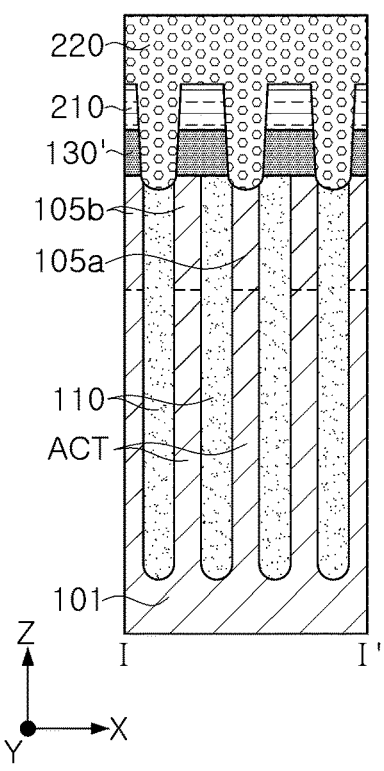
Figure 5C:
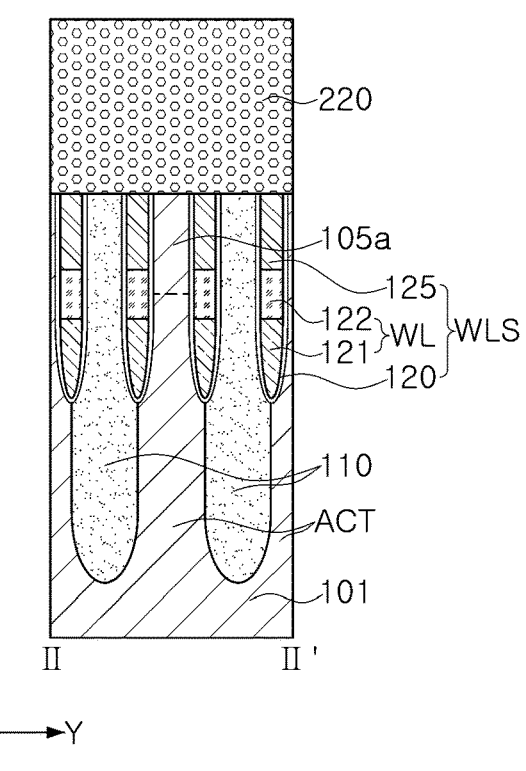
Figure 5D:
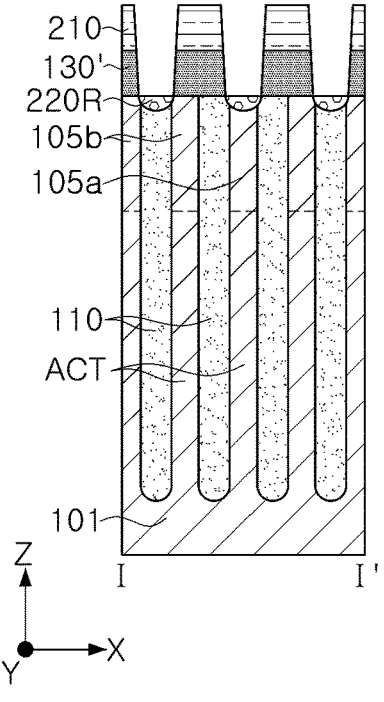
Figure 5D:
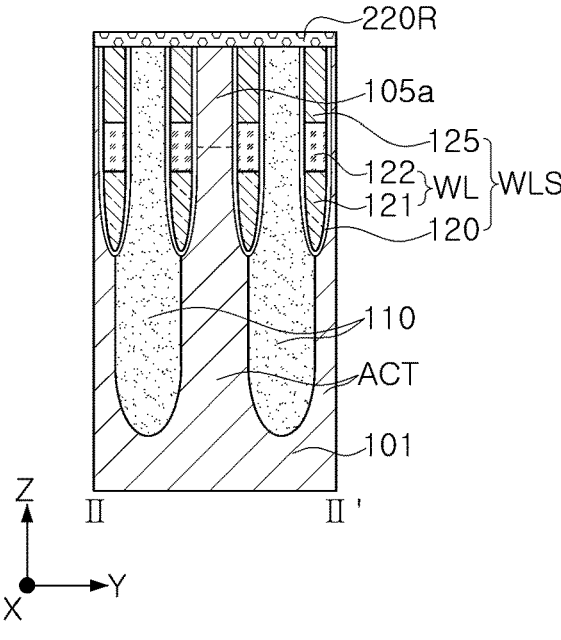
Figure 5E:
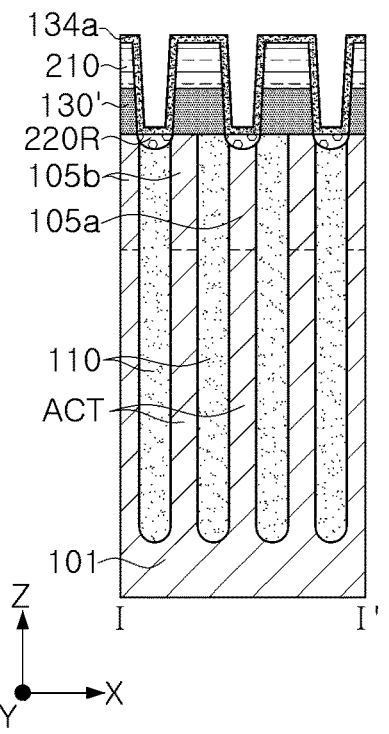
Figure 5E:
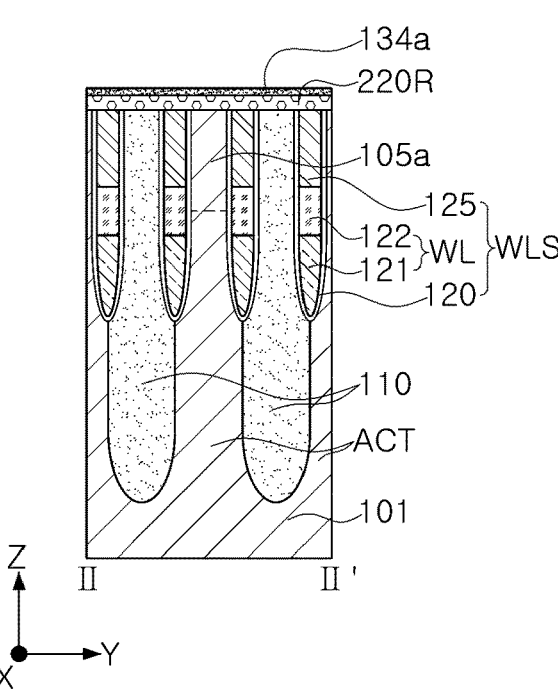
Figure 5F:
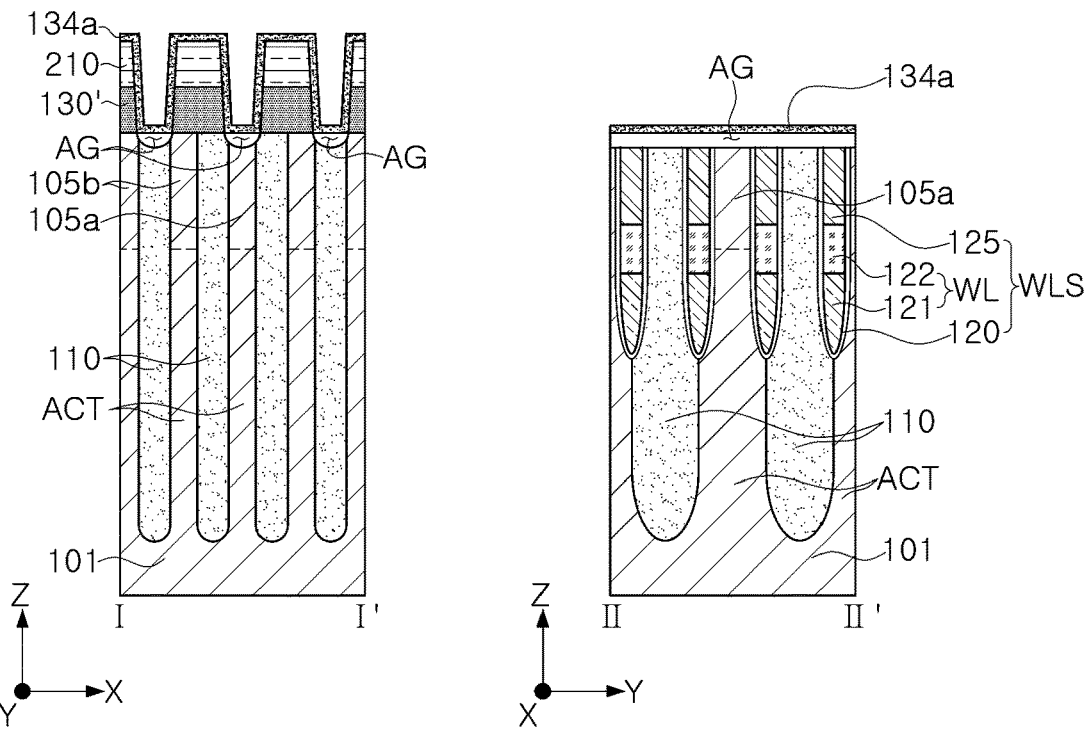
Figure 5G:
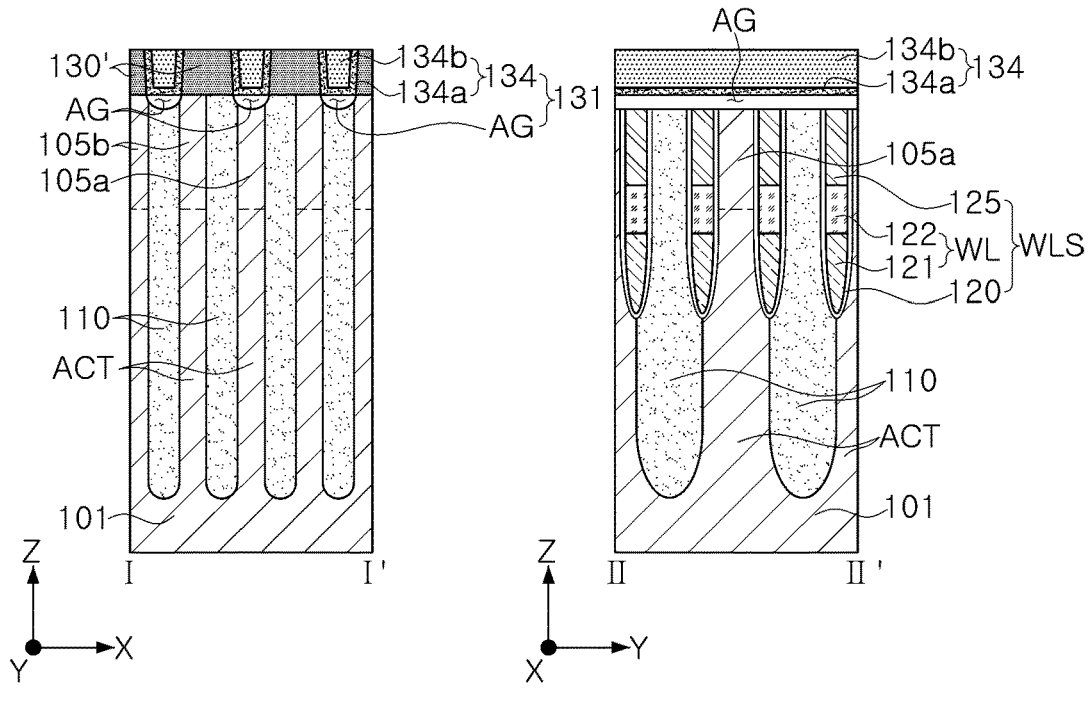
Figure 5H:
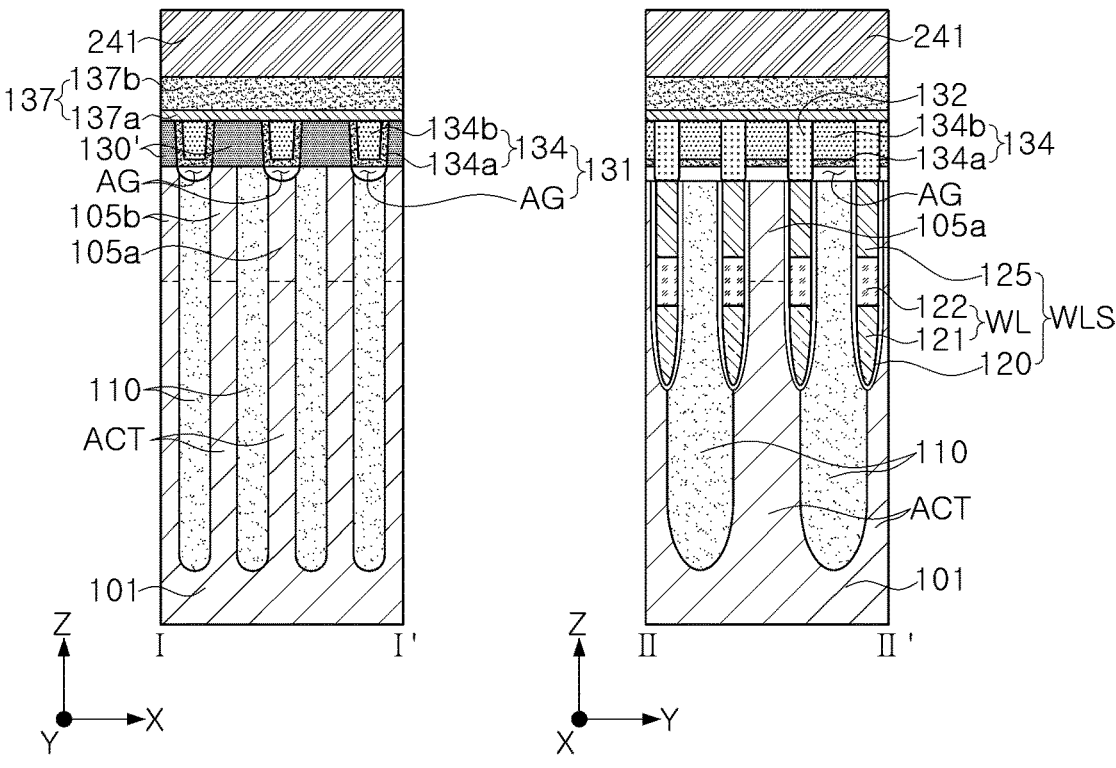
Figure 5I:
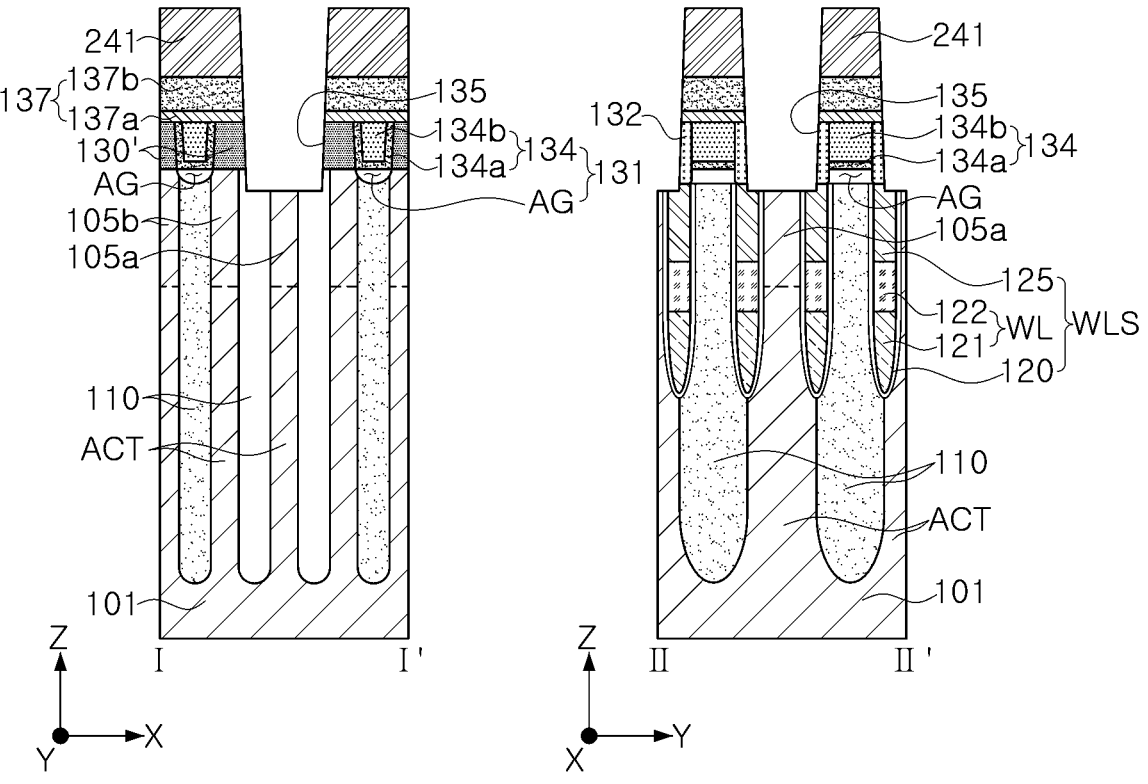

The shape of the lower surface of the bit line contact pattern DC may be formed while the bit line contact hole 135 merges with the airgap AG even when the bit line contact hole 135 is formed to have a relatively low depth as illustrated in FIG. 5I. Alternatively, as illustrated in FIG. 6G, the shape of the lower surface of the bit line contact pattern DC may be formed by removing the residual layer 131R of the first separation layer 131 formed of silicon oxide in a subsequent process, even when the bit line contact hole 135 is formed to have a relatively low depth.

FIGS. 5A to 5I are cross-sectional views illustrating a method of manufacturing a semiconductor device according to example embodiments.

Referring to FIG. 5A, the device isolation layer 110 may be formed on the substrate 101 to limit or define the active regions ACT. Impurity regions may be formed on the active regions ACT by performing an ion implantation process using the device isolation layer 110 as an ion implantation mask.

The gate trench 115 may be formed by patterning the active regions ACT and the device isolation layer 110, and a gate dielectric layer 120, a word line WL and a gate capping layer 125 may be formed in the gate trench 115. Accordingly, the word line structure WLS may be formed. The impurity regions may be separated from each other by the gate trench 115 to form a first impurity region 105a and a second impurity region 105b.

A preliminary pad layer 130' and a mask layer 210 may be formed on the substrate 101. The preliminary pad layer 130' may be formed of polysilicon. The mask layer 210 may be formed on the preliminary pad layer 130'. The mask layer 210 may be formed of, for example, silicon oxide, but is not limited thereto.

Referring to FIG. 5B, trenches T passing through the preliminary pad layer 130' may be formed. By performing a photolithography process and an etching process, the trenches T extending through the mask layer 210 and penetrating through the preliminary pad layer 130' may be formed to expose an upper surface of the device isolation layer 110. During a time when the trenches T may be formed, the upper surface of the device isolation layer 110 may be over-etched to form a recessed upper surface of the device isolation layer 110. The trenches T extend in the Y direction, and the preliminary pad layer 130' may be formed of a plurality of patterns separated from each other in the X direction by the trenches T.

Referring to FIG. 5C, a sacrificial layer 220 filling the trenches T may be formed. The sacrificial layer 220 may be formed to cover the upper surface of the mask layer 210 while filling the trenches T. The sacrificial layer 220 may include or may be formed of, for example, a material that may be removed by a heat treatment process. The sacrificial layer 220 may include or may be formed of carbon.

Referring to FIG. 5D, an etch-back process of etching the sacrificial layer 220 may be performed while leaving the remainder 220R of the sacrificial layer 220 below the trenches T. The thickness of the remainder 220R of the sacrificial layer 220 may be variously changed according to example embodiments.

Referring to FIG. 5E, a first insulating layer 134a may be formed on the remainder 220R of the sacrificial layer 220. The first insulating layer 134a may be conformally formed along sidewalls of the trenches T. The first insulating layer 134a may be formed in a low-temperature process in a range in which the remainder 220R of the sacrificial layer 220 is not thermally decomposed.

Referring to FIG. 5F, an airgap AG may be formed by removing the remainder 220R of the sacrificial layer 220 through a thermal decomposition process. The airgap AG may be formed of an empty space between the substrate 101 and the first insulating layer 134a.

Referring to FIG. 5G, the second insulating layer 134b may be formed on the first insulating layer 134a by filling the trenches T with an insulating material and performing a planarization process. The planarization process may include performing the insulating material etch-back process to fill the trenches T. The mask layer 210 may be removed. Accordingly, the insulating pattern 134 including the first insulating layer 134a and the second insulating layer 134b, and the first separation layer 131 including the airgap AG, may be formed. The first insulating layer 134a may include or may be formed of an insulating material, for example, silicon oxide, silicon nitride, or silicon oxynitride. The second insulating layer 134b may include or may be formed of an insulating material, for example, silicon oxide, silicon nitride, or silicon oxynitride. In some embodiments, the first and second insulating layers 134a and 134b may be the same as or different from each other in material.

Referring to FIG. 5H, second separation layers 132 penetrating through the preliminary pad layer 130' may be formed, and a buffer insulating layer 137 and a mask layer 241 may be formed. The second separation layers 132 may extend in the X direction. The preliminary pad layer 130' may be formed of a plurality of patterns separated from each other in the Y direction by the second separation layers 132. The second separation layers 132 may be formed to penetrate through the preliminary pad layer 130' and may overlap the word lines WL, respectively. In some embodiments, the first and second separation layers 131 and 132 may separate the preliminary pad layer 130' into individual pad layers 130 as shown in FIG. 1.

Referring to FIG. 5I, a bit line contact hole 135 exposing the first impurity region 105a of the active region ACT may be formed. A lower end of the bit line contact hole 135 may be formed at a level lower than a level of lower ends of the first separation layer 131 and the second separation layer 132.

In another example, even in the case in which the bit line contact hole 135 does not completely penetrate through the first separation layer 131, since the first separation layer 131 includes the airgap AG, the first impurity region 105a of the active region ACT may be exposed through the airgap AG combined with the bit line contact hole 135. Therefore, even when the bit line contact hole 135 is formed to have a relatively shallow depth, a connection margin between the bit line BL and the active region ACT may be secured.

Next, the bit line BL including the bit line contact pattern DC, the bit line capping pattern BC on the bit line BL, and the bit line contact spacer DCS may be formed. Accordingly, the bit line structure BLS may be formed. Insulating spacer layers may be formed on a side surface of the bit line structure BLS, and a portion of the insulating spacer layers may be etched to form the spacer structure SS. Contact holes may be formed to partially expose the pad layers 130. Before forming the contact holes, sacrificial patterns may be formed between the bit line structures BLS. A portion of the sacrificial patterns that overlaps the word line structure WLS may be etched. After etching the portion of the sacrificial patterns, the etched portion may be filled with a material different from the sacrificial patterns, thereby forming insulating fences (not illustrated). A barrier layer 161 and a contact conductive layer 162 may be formed in the contact holes to form a contact structure 160. Isolation insulating patterns 170 passing through the contact structure 160 may be formed, and an etch stop layer 175 and an data storage structure DS may be formed on the contact structure 160. Accordingly, the semiconductor device 100 of FIGS. 1 to 3A may be manufactured.

FIGS. 6A to 6G are cross-sectional views illustrating a method of manufacturing a semiconductor device according to example embodiments.

Figure 6A:
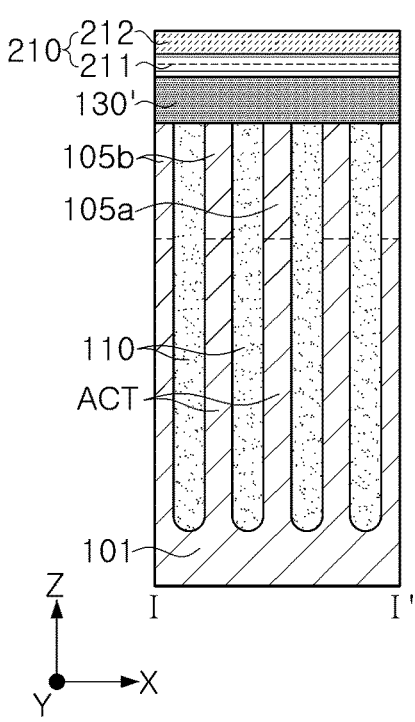
FIGS. 6A to 6G are cross-sectional views illustrating a method of manufacturing a semiconductor device according to example embodiments.
Figure 6A:
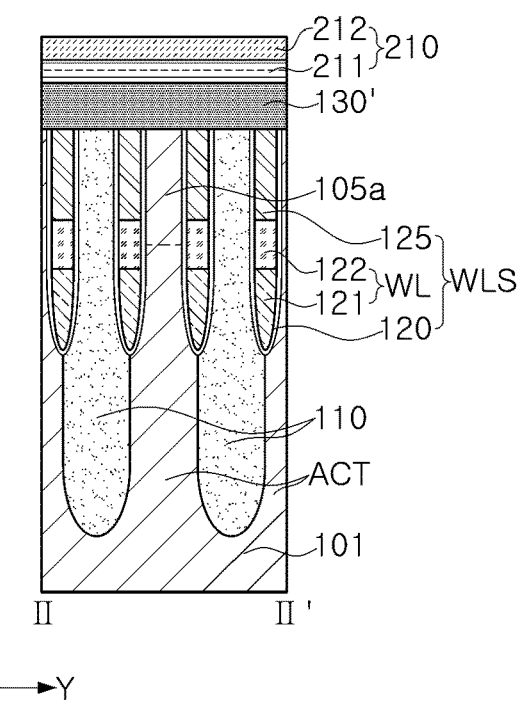

Referring to FIG. 6A, as described with reference to FIG. 5A, the device isolation layer 110, the active regions ACT, the word line structure WLS, the preliminary pad layer 130', and the mask layer 210 may be formed, and the mask layer 210 may be formed of a double layer including the first mask layer 211 and the second mask layer 212 including different materials. For example, the first mask layer 211 may be formed of silicon oxide, and the second mask layer 212 may be formed of silicon nitride.

Figure 6B:
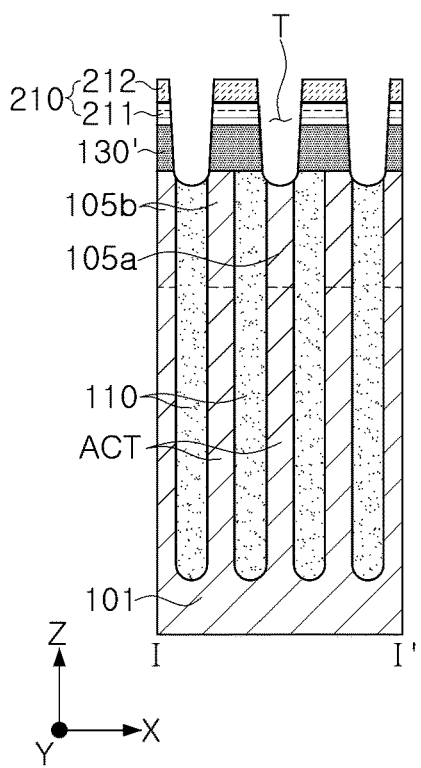
Figure 6B:
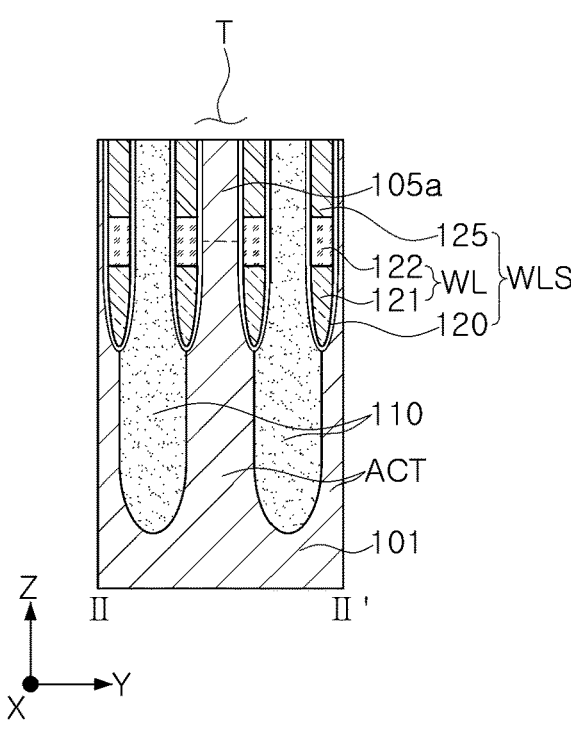

Referring to FIG. 6B, trenches T passing through the preliminary pad layer 130' may be formed. By performing a photolithography process and an etching process, trenches T extending through the mask layer 210 and penetrating through the preliminary pad layer 130' to recess the upper portion of the device isolation layer 110 may be formed. The trenches T extend in the Y direction, and the preliminary pad layer 130' may be formed of a plurality of patterns separated from each other in the X direction by the trenches T.

Figure 6C:
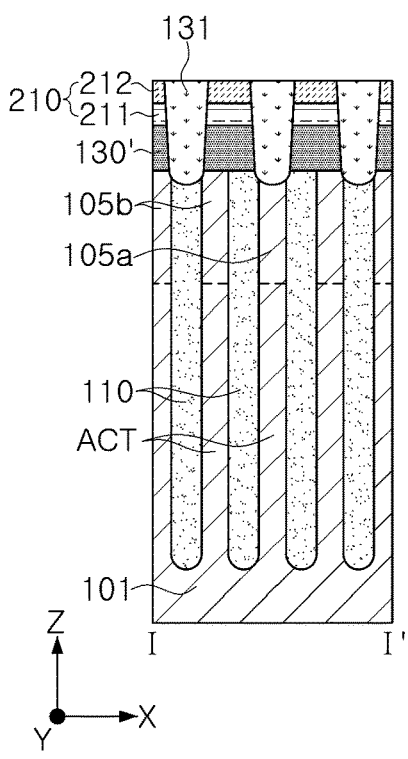
Figure 6C:
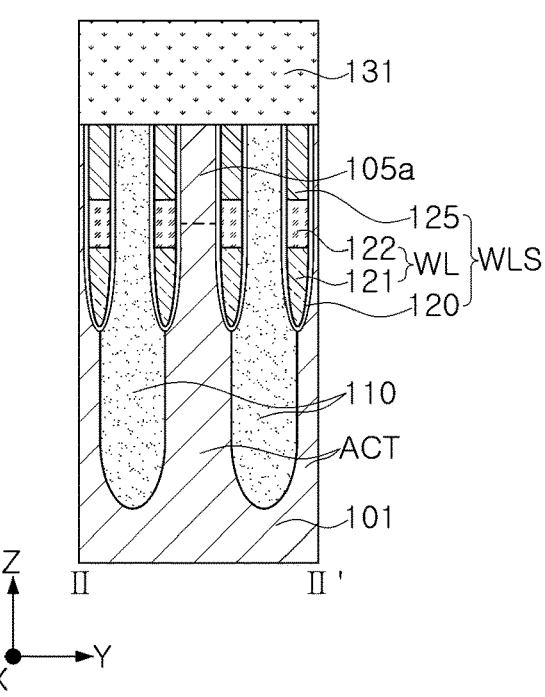

Referring to FIG. 6C, first separation layers 131 filling the trenches T may be formed. The first separation layers 131 may include or may be formed of a material other than silicon nitride, for example, a material having a dielectric constant lower than a dielectric constant of silicon nitride. For example, the first separation layer 131 may include or may be formed of at least one of silicon oxide, silicon oxycarbide, and silicon oxycarbonitride.

Figure 6D:
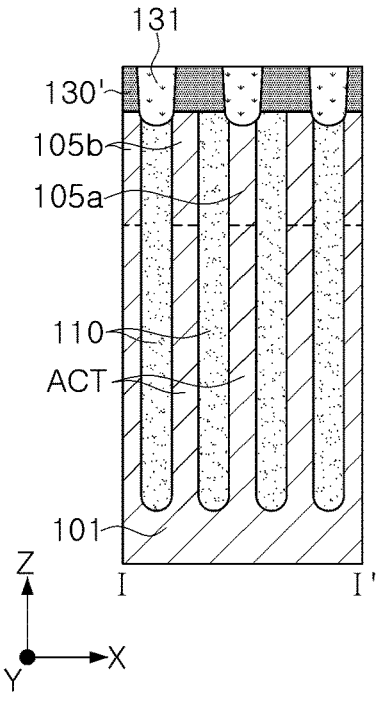
Figure 6D:
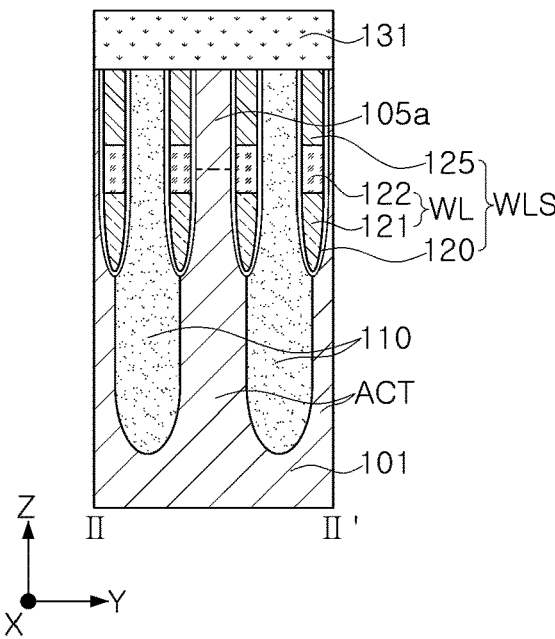

Referring to FIG. 6D, an etch-back process of etching the first separation layers 131 may be performed to expose the upper surface of the second mask layer 212, and then, the second mask layer 212 and the first mask layer 211 may be removed sequentially. While removing the first mask layer 211, a portion of the first separation layers 131 may also be removed.

Figure 6E:
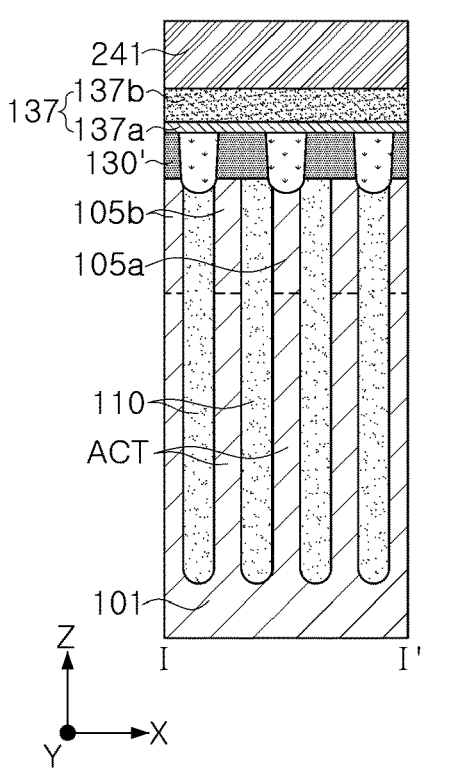
Figure 6E:
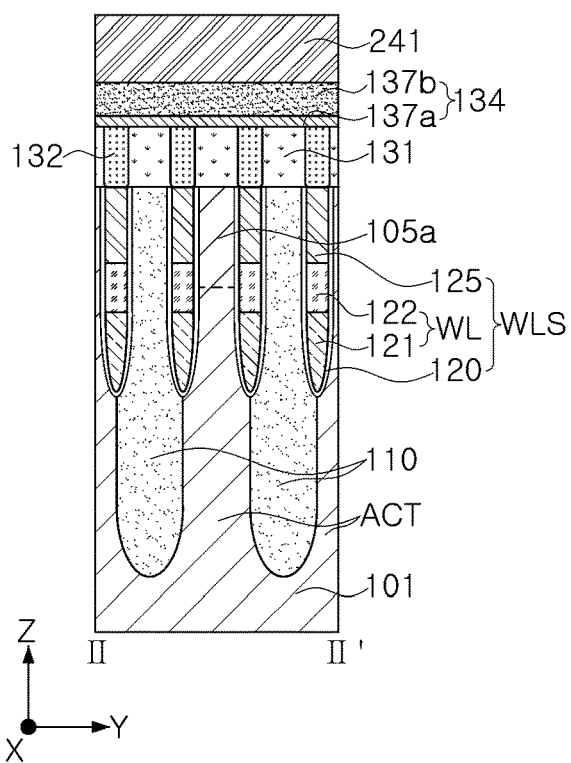

Referring to FIG. 6E, second separation layers 132 penetrating through the preliminary pad layer 130' may be formed, and a buffer insulating layer 137 and a mask layer 241 may be formed. The second separation layers 132 may extend in the X direction. The preliminary pad layer 130' may be formed of a plurality of patterns separated from each other in the Y direction by the second separation layers 132. The second separation layers 132 may be formed to penetrate through the preliminary pad layer 130'. The second separation layers 132 may vertically overlap the word lines WL, respectively.

Figure 6F:
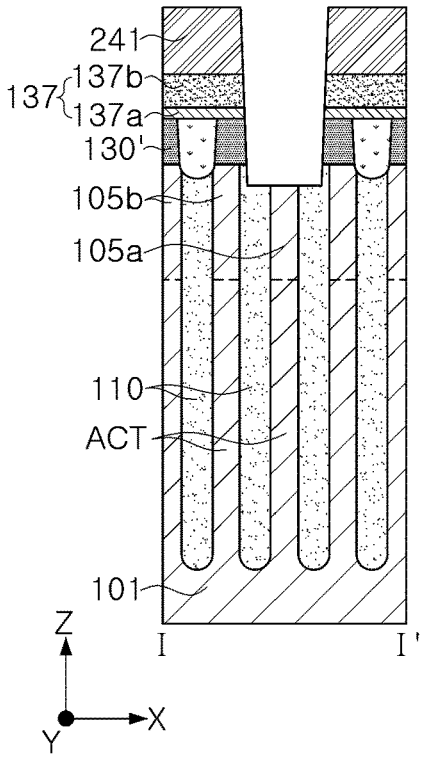
Figure 6F:
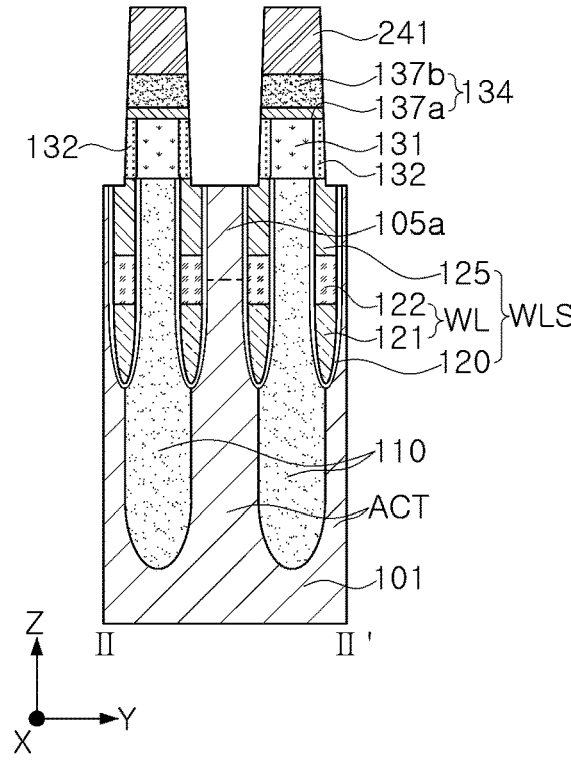
Figure 6G:
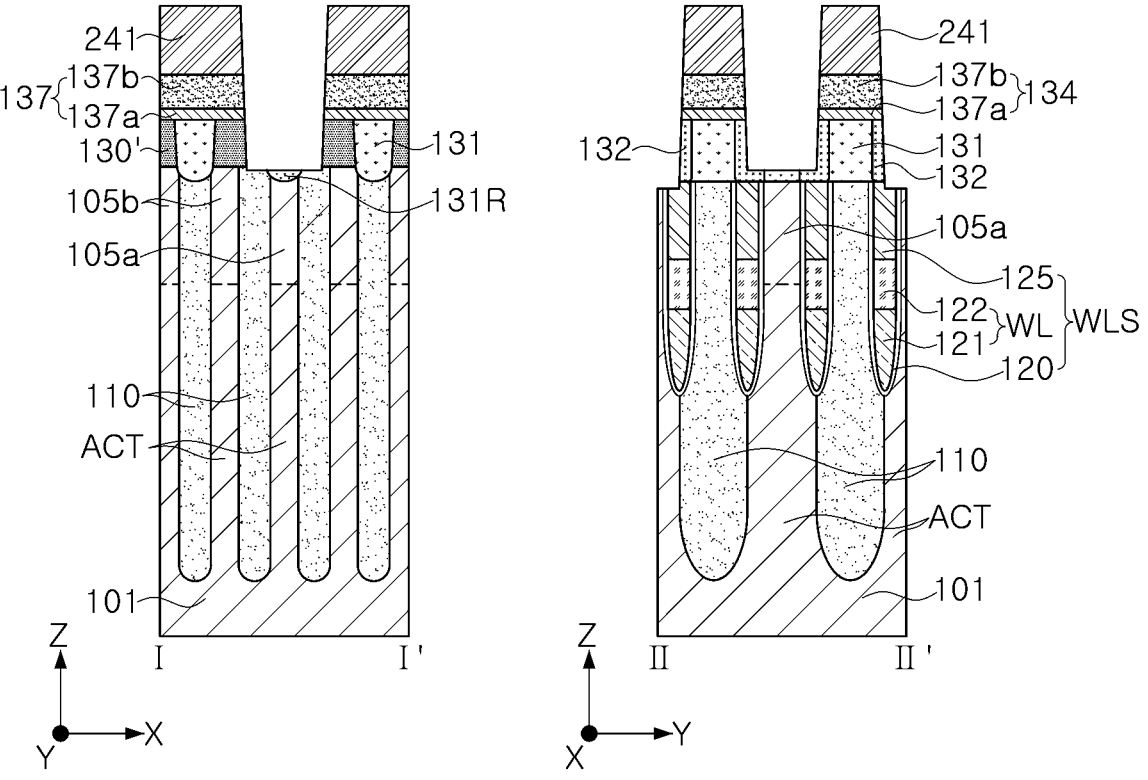

Referring to FIG. 6F, a bit line contact hole 135 may be formed and a subsequent process may be performed to form a bit line structure BLS, a contact structure 160, and an data storage structure DS.

Referring to FIG. 6G, in another example, even in the case in which the bit line contact hole 135 does not completely penetrate through the first separation layer 131, since the first separation layer 131 is formed of silicon oxide, the first impurity region 105a of the active region ACT may be exposed as the residual layer 131R of the first separation layer 131 is removed while a cleaning process or the like is performed through the bit line contact hole 135. Accordingly, even when the bit line contact hole 135 is formed to have a relatively shallow depth, a connection margin between the bit line BL and the active region ACT may be secured.

Figure 7A:
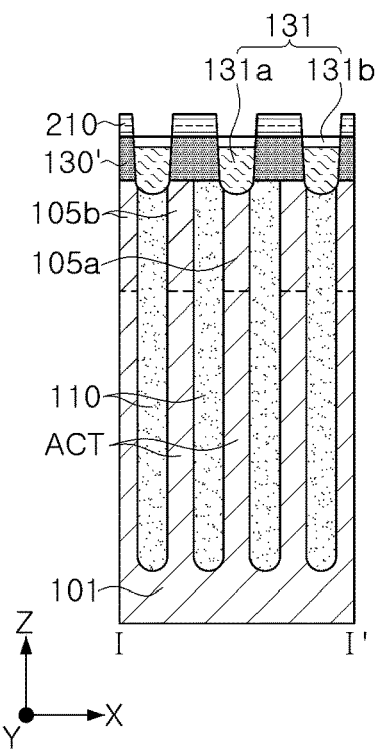
FIGS. 7A and 7B are cross-sectional views illustrating a method of manufacturing a semiconductor device according to example embodiments.
Figure 7A:
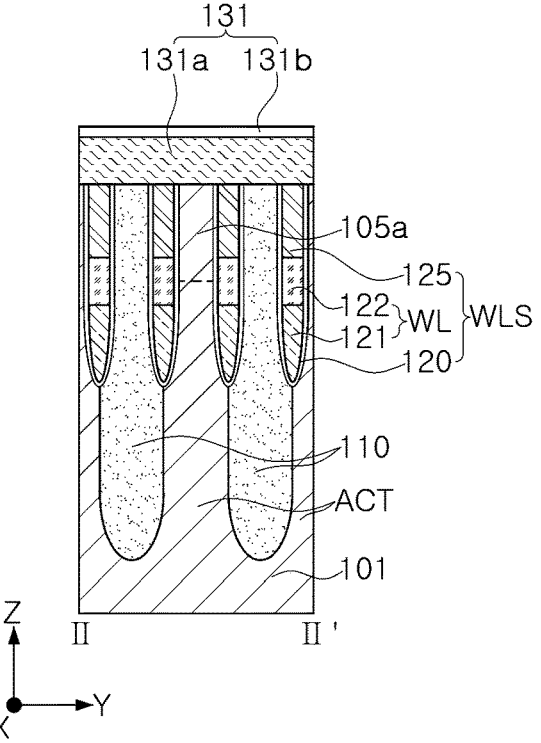
Figure 7B:
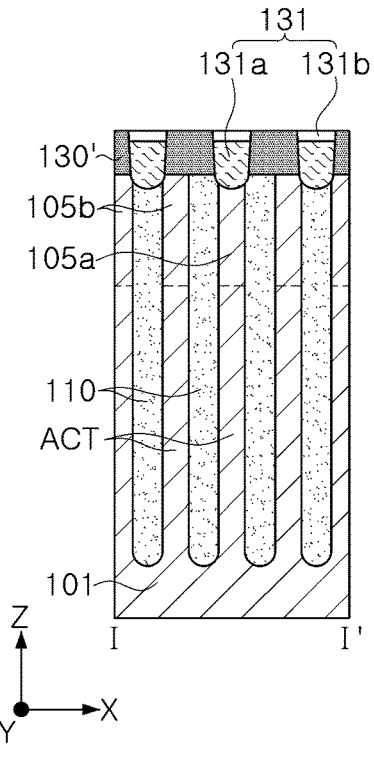
Figure 7B:
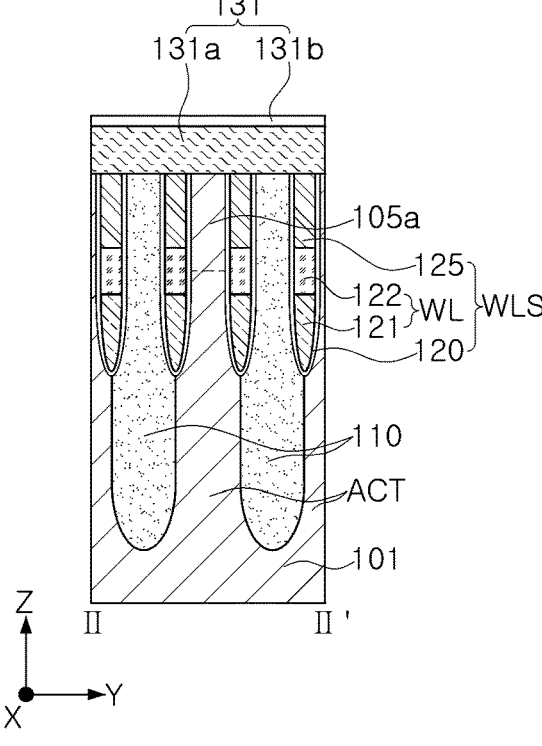

FIGS. 7A and 7B are cross-sectional views illustrating a method of manufacturing a semiconductor device according to example embodiments.

Referring to FIG. 7A, after the manufacturing operations of the semiconductor device up to FIG. 6C, the upper surfaces of the first separation layers 131 may be etched to a level lower than a level of the upper surface of the preliminary pad layer 130' by an etch-back process to form an insulating layer 131a, the capping layer 131b may be formed on the insulating layer 131a, and the second mask layer 212 may be removed.

Referring to FIG. 7B, the first mask layer 211 may be removed. On the side surface of the preliminary pad layer 130', the insulating layer 131a and the capping layer 131b may remain to form the first separation layer 131. A subsequent process may be performed to form the bit line structure BLS, the contact structure 160, the data storage structure DS, and the like.

As set forth above, since the separation layer passing through the pad layer includes an airgap or a material having a dielectric constant less than a dielectric constant of silicon nitride, a semiconductor device having improved electrical characteristics and reliability may be provided.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
an active region defined by a device isolation layer in a substrate;
a pad layer on the device isolation layer and a first region of the active region;
a first separation layer penetrating through the pad layer and extending in a first direction;
a second separation layer penetrating through the pad layer and extending in a second direction, intersecting the first direction;
a word line buried in the substrate and disposed below the second separation layer, wherein the word line extends across the active region in the second direction;
a bit line extending in the first direction on the first separation layer and connected to a second region of the active region;
a contact structure on a side surface of the bit line and connected to a portion of the pad layer; and
a data storage structure on the contact structure and electrically connected to the contact structure,
wherein the first separation layer includes at least one of an air gap and a material having a dielectric constant less than a dielectric constant of silicon nitride.

2. The semiconductor device of claim 1,
wherein a lower surface of the first separation layer is located at a level lower than a level of a lower surface of the pad layer.

3. The semiconductor device of claim 1,
wherein the first separation layer includes an air gap,
wherein the first separation layer further includes an insulating pattern on the air gap, and
wherein the air gap is an empty space surrounded by the second separation layer, the insulating pattern, and at least one of the active region and the device isolation layer.

4. The semiconductor device of claim 3,
wherein the pad layer includes polysilicon, and
wherein the insulating pattern includes silicon nitride.

5. The semiconductor device of claim 1, further comprising:
a bit line contact hole exposing the second region of the active region; and
a bit line contact spacer disposed in the bit line contact hole,
wherein the bit line includes a first conductive pattern,
wherein the first conductive pattern includes a bit line contact pattern disposed in the bit line contact hole and contacting the second region of the active region exposed by the bit line contact hole,
wherein the bit line contact spacer covers a side surface of the bit line contact pattern, and
wherein a lower end of the bit line contact pattern is at a level lower than a level of a lower end of the bit line contact spacer.

6. The semiconductor device of claim 1,
wherein the pad layer includes a pad protrusion contacting a protruding upper side surface of the active region protruding from an upper surface of the device isolation layer, and
wherein the first separation layer contacts the pad protrusion.

7. A semiconductor device comprising:
an active region defined by a device isolation layer in a substrate;
a pad layer on the device isolation layer and a first region of the active region;
a first separation layer penetrating through the pad layer and extending in a first direction;
a bit line extending on the substrate in the first direction and connected to a second region of the active region; and
a contact structure on a side surface of the bit line and connected to a portion of the pad layer,
wherein the first separation layer includes an air gap and an insulating pattern on the air gap.

8. The semiconductor device of claim 7,
wherein the air gap is an empty space surrounded by the insulating pattern and at least one of the active region and the device isolation layer.

9. The semiconductor device of claim 7,
wherein the device isolation layer has a recessed upper surface, and
wherein the air gap is disposed between the insulating pattern and the recessed upper surface of the device isolation layer.

10. The semiconductor device of claim 7,
wherein the air gap is disposed between the insulating pattern and each of the active region and the device isolation layer.

11. The semiconductor device of claim 7,
wherein the insulating pattern includes a first insulating layer and a second insulating layer on the first insulating layer, and
wherein the first insulating layer surrounds a lower surface and side surfaces of the second insulating layer.

12. The semiconductor device of claim 7, further comprising:
a bit line contact hole exposing the second region of the active region,
wherein the bit line includes a first conductive pattern, and
wherein the first conductive pattern includes a bit line contact pattern disposed in the bit line contact hole and contacting the second region of the active region exposed by the bit line contact hole.

13. The semiconductor device of claim 12,
wherein a lower surface of the bit line contact pattern includes a first portion and a second portion around the first portion, and
wherein the first portion convexly protrudes downwards from the second portion.

14. The semiconductor device of claim 13, further comprising:
a bit line contact spacer disposed in the bit line contact hole and covering a side surface of the bit line contact pattern,
wherein the first portion of the bit line contact pattern is positioned at a level lower than a level of a lower end of the bit line contact spacer.

15. The semiconductor device of claim 7, further comprising:

a second separation layer penetrating through the pad layer and extending in a second direction, intersecting the first direction.

16. The semiconductor device of claim 15, further comprising:

a word line disposed below the second separation layer, wherein the word line extends across the active region and extends into the device isolation layer.

17. A semiconductor device comprising:

an active region defined by a device isolation layer in a substrate;

a pad layer on the device isolation layer and a first region of the active region;

a separation layer penetrating through the pad layer and extending in a first direction, wherein the separation layer contacts the device isolation layer at a level below a top surface of the active region;

a bit line extending on the substrate in the first direction and connected to a second region of the active region; and a contact structure on a side surface of the bit line and connected to a portion of the pad layer, wherein the separation layer has a dielectric constant less than a dielectric constant of silicon nitride.

18. The semiconductor device of claim 17, wherein the separation layer includes at least one of silicon oxide, silicon oxycarbide, and silicon oxycarbonitride.

19. The semiconductor device of claim 17, wherein the separation layer includes an air gap having a dielectric constant less than a dielectric constant of silicon nitride and an insulating pattern on the air gap, wherein the pad layer includes a pad protrusion contacting the device isolation layer, and wherein a lower end of the pad protrusion is located at a level lower than a level of an upper end of the active region and is located at a level higher than a level of a lower end of the air gap.

20. The semiconductor device of claim 17, wherein the separation layer includes:

an insulating layer comprising at least one of silicon oxide, silicon oxycarbide, and silicon oxycarbonitride; and a capping layer disposed on the insulating layer and comprising silicon nitride.

* * * * *